United States Patent
Sugiyama

(10) Patent No.: US 10,509,166 B2
(45) Date of Patent: Dec. 17, 2019

(54) TUNABLE OPTICAL SOURCE AND OPTICAL MODULE

(71) Applicant: Fujitsu Optical Components Limited, Kawasaki-shi, Kanagawa (JP)

(72) Inventor: Masaki Sugiyama, Kawasaki (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

(21) Appl. No.: 16/048,753

(22) Filed: Jul. 30, 2018

(65) Prior Publication Data
US 2019/0041577 A1 Feb. 7, 2019

(30) Foreign Application Priority Data
Aug. 3, 2017 (JP) .................................. 2017-150962

(51) Int. Cl.
*G02B 6/12* (2006.01)
*G02B 6/293* (2006.01)

(52) U.S. Cl.
CPC ..... *G02B 6/12007* (2013.01); *G02B 6/12004* (2013.01); *G02B 6/29344* (2013.01); *G02B 6/29395* (2013.01); *G02B 2006/1215* (2013.01); *G02B 2006/12107* (2013.01); *G02B 2006/12109* (2013.01); *G02B 2006/12123* (2013.01); *G02B 2006/12138* (2013.01); *G02B 2006/12142* (2013.01); *G02B 2006/12147* (2013.01)

(58) Field of Classification Search
None
See application file for complete search history.

(56) References Cited

U.S. PATENT DOCUMENTS

| | | | |
|---|---|---|---|
| 9,559,487 B2* | 1/2017 | Doerr | H01S 3/10015 |
| 10,082,628 B2* | 9/2018 | Sugiyama | G02B 6/125 |
| 10,103,809 B2* | 10/2018 | Sugiyama | H04B 10/07957 |
| 10,312,663 B2* | 6/2019 | Takabayashi | H01S 5/0687 |
| 10,349,492 B2* | 7/2019 | Sugiyama | |
| 10,355,448 B2* | 7/2019 | Sugiyama | |
| 2002/0118906 A1 | 8/2002 | Onoe | |
| 2011/0122906 A1* | 5/2011 | Seeley | G01J 9/0246 372/38.07 |
| 2013/0094527 A1 | 4/2013 | Fukuda et al. | |
| 2014/0376001 A1* | 12/2014 | Swanson | A61B 5/0066 356/479 |
| 2015/0085292 A1* | 3/2015 | Uesaka | G01J 9/0246 356/477 |
| 2015/0117811 A1 | 4/2015 | Héroux | |

(Continued)

*Primary Examiner* — Michelle R Connelly
(74) *Attorney, Agent, or Firm* — Staas & Halsey LLP

(57) ABSTRACT

A tunable optical source includes a substrate, a light source disposed on the substrate, and a wavelength selecting element configured to select light of a specific wavelength as output light, from light emitted from the light source, in accordance with a control signal. On the substrate, a wavelength filter including multiple output ports and a photodetector are disposed. The wavelength filter is configured to receive a part of the output light and to output light beams to the respective output ports. The photodetector is configured to receive the light beam output from one of the output ports. The tunable optical source further includes an inspection waveguide connecting to the photodetector at one end, and an inspection light input unit for inputting inspection light provided at the other end of the inspection waveguide.

8 Claims, 19 Drawing Sheets

(56) References Cited

U.S. PATENT DOCUMENTS

| | | | | |
|---|---|---|---|---|
| 2017/0353001 A1* | 12/2017 | Takabayashi | ....... | H01S 5/06255 |
| 2017/0357054 A1* | 12/2017 | Sugiyama | .............. | G02B 6/125 |
| 2018/0183517 A1* | 6/2018 | Sugiyama | ........ | H04B 10/07957 |
| 2018/0323879 A9* | 11/2018 | Evans | .................. | H01S 5/02453 |
| 2019/0041581 A1* | 2/2019 | Sugiyama | .......... | G02B 6/29395 |
| 2019/0041670 A1* | 2/2019 | Sugiyama | ............. | G02F 1/0147 |

\* cited by examiner

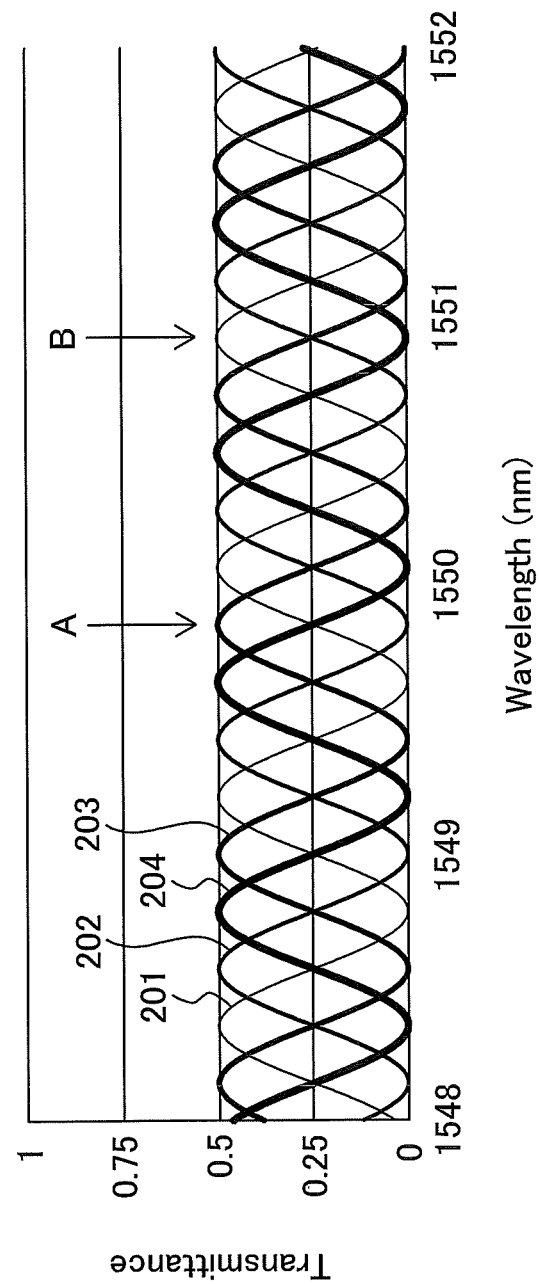

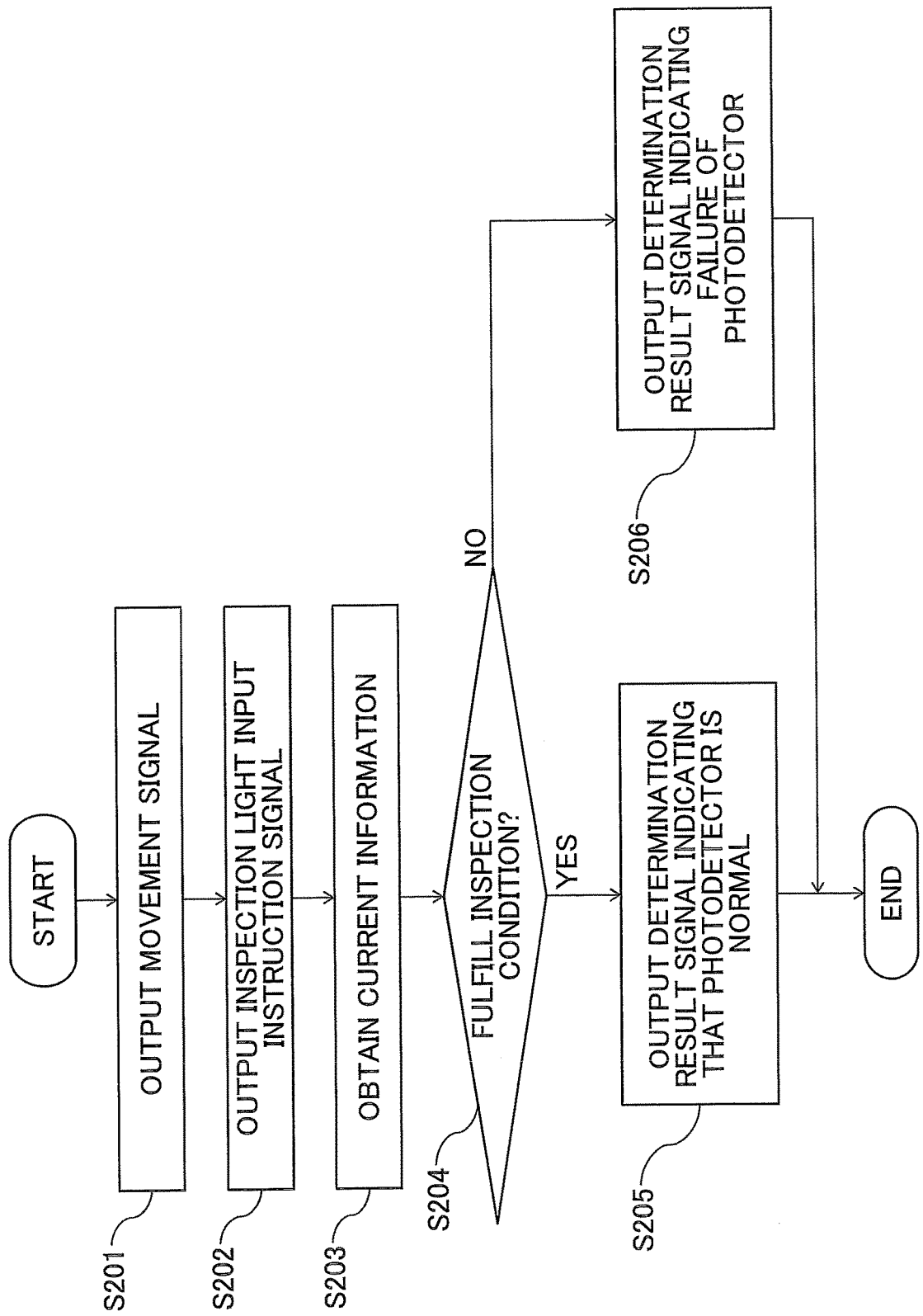

TUNABLE OPTICAL SOURCE AND OPTICAL MODULE

CROSS-REFERENCE TO RELATED APPLICATION

This application is based upon and claims the benefit of priority of the prior Japanese Patent Application No. 2017-150962, filed on Aug. 3, 2017, the entire contents of which are incorporated herein by reference.

FIELD

The embodiments discussed herein relate to a tunable optical source and an optical module.

BACKGROUND

A technique for disposing optical elements, such as a waveguide, a coupler, and a diode, on a substrate is known. For instance, a technique for forming, on a substrate, a demultiplexer for a wavelength division multiplexing system, which includes multiple waveguides and a photodetector receiving light passing through each of the waveguides, is known (see Patent Document 1, for example). Also, there is known a technique for receiving light entered from a side surface of a substrate by forming a waveguide layer around a photodetector disposed on the substrate (see Patent Document 2, for example). Further, there is known a technique for receiving light emitted from a light emitter such as a laser diode disposed on a substrate, by a photodetector through an optical waveguide and a ring resonator (see Patent Document 3, for example).

However, in a light source in which both a light emitter and a photodetector are disposed on a substrate, an end of an optical waveguide for transmitting light emitted from the light emitter to the photodetector is not formed at an end surface of the substrate. Accordingly, it is difficult to inspect, at a time of shipping or the like, the photodetector by inputting light to the photodetector.

The following is reference documents:
[Patent Document 1] United States Patent Application Publication No. 2015/0117811,
[Patent Document 2] United States Patent Application Publication No. 2002/0118906,
[Patent Document 3] United States Patent Application Publication No. 2013/0094527.

SUMMARY

In one aspect, a tunable optical source includes: a substrate; a light source disposed on the substrate; a wavelength selecting element configured to select light of a specific wavelength as output light, from light emitted from the light source in accordance with a control signal; a wavelength filter disposed on the substrate which includes multiple output ports and which is configured to receive a part of the output light and to output light beams to the respective output ports; a photodetector disposed on the substrate so as to receive the light beam output from one of the plurality of output ports; an inspection waveguide connecting to the photodetector at one end; and an inspection light input unit for inputting inspection light which is provided at the other end of the inspection waveguide.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIG. 2 is a graph representing a filtering characteristic of a wavelength filter illustrated in FIG. 1A;
FIG. 17 is a flowchart illustrating a flow of an inspection process for inspecting a photodetector in the tunable optical source according to the embodiments performed by the inspection apparatus illustrated in FIG. 16.

DESCRIPTION OF EMBODIMENT

Hereinafter, a tunable optical source and an optical module according to embodiments will be described with reference to the drawings. Note that a technical scope of the present invention is not limited to the embodiments. For example, the tunable optical source may be made by combining a feature of a tunable optical source according to a first embodiment, a feature of a tunable optical source according to a second embodiment, a feature of a tunable optical source according to a third embodiment, and a feature of a tunable optical source according to a fourth embodiment.

<Related Tunable Optical Source of the Tunable Optical Source According to the Present Disclosure>

Before describing an inspecting method of an optical part of the tunable optical source according to the present disclosure, a tunable optical source related to the tunable optical source according to the present disclosure will be described.

Figure 1A:
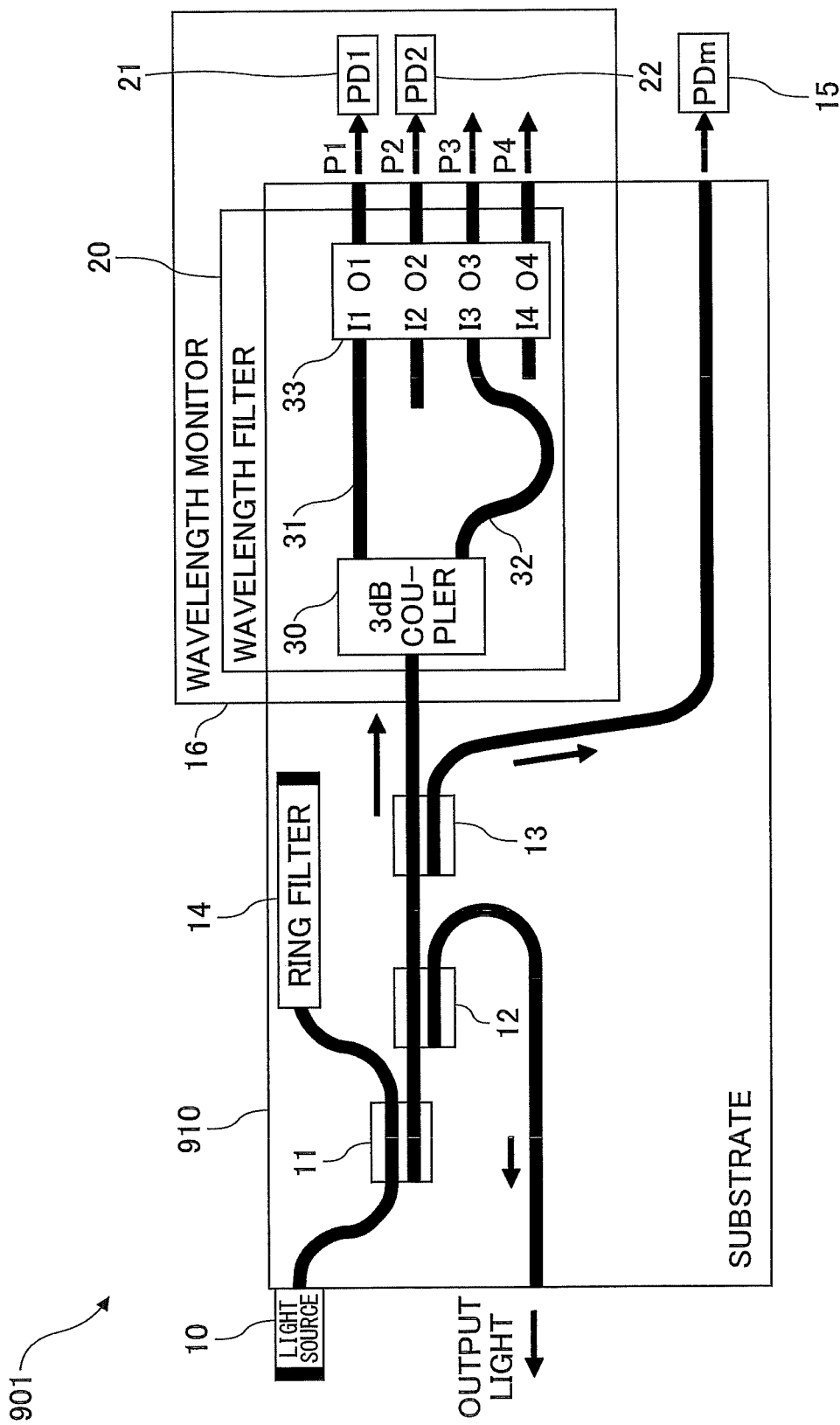
FIG. 1A is a diagram illustrating a first optical part of a tunable optical source according to a related art.
Figure 1B:
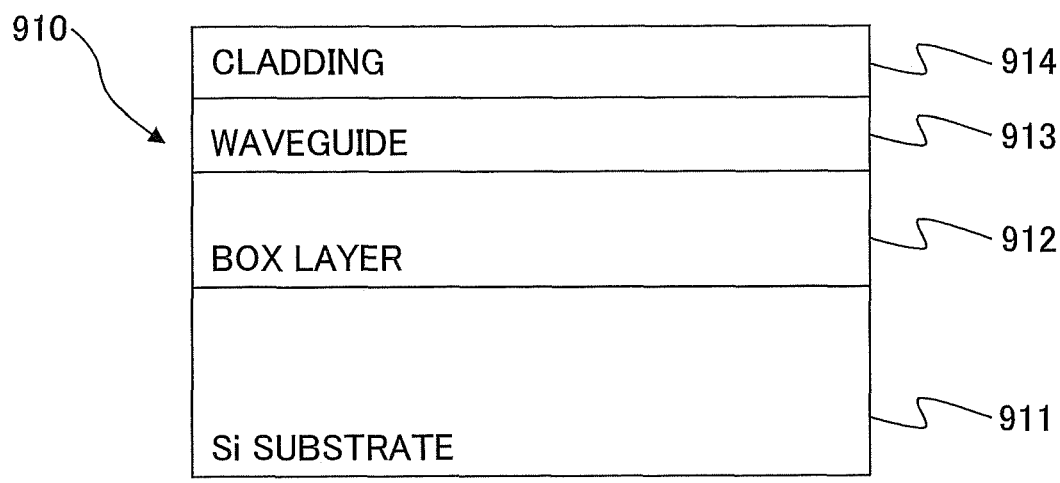
FIG. 1B is a cross-sectional view of a substrate illustrated in FIG. 1A.

FIG. 1A is a diagram illustrating a first optical part of the related tunable optical source, and FIG. 1B is a cross-sectional view of a substrate illustrated in FIG. 1A.

The optical part 901 may also be referred to as a TLS (Tunable Laser Source), and includes a light source 10, a first tap 11, a second tap 12, a third tap 13, a ring filter 14, a power monitoring element 15, and a wavelength monitor 16. The wavelength monitor 16 includes a wavelength filter 20, a first monitoring element 21, and a second monitoring element 22.

The light source 10 is a semiconductor laser, for example, and is made from a semiconductor material such as GaAs or AlGaAs. The light source 10 may be, for example, an SOA (Semiconductor Optical Amplifier) for emitting a natural light. The first tap 11, the second tap 12, and the third tap 13 are splitters for splitting input light, and are formed on a substrate 910 with waveguides for guiding light emitted from the light source 10 to the ring filter 14 and the wavelength monitor 16. The light source 10 emits light whose quantity varies in accordance with a current corresponding to a control signal entered from a control unit (not illustrated).

The substrate 910 includes a silicon substrate 911 (may also be referred to as an "Si substrate"), a BOX layer 912 formed of silicon oxide film, a waveguide 913 formed of silicon oxynitride film, and a cladding 914 formed of silicon oxide film covering the waveguide 913. The silicon substrate 911 is made of a silicon material formed by a single crystal in the present embodiment. However, the silicon substrate 911 may be made of a silicon material formed by a polycrystal. Or, the silicon substrate 911 may include an impurity doped layer.

The first tap 11 is formed such that the first tap 11 outputs light to the ring filter 14 larger than light output to the second tap 12. For example, the first tap 11 is formed such that the light output to the ring filter 14 is ten times larger than the light output to the second tap 12.

From the second tap 12, output light of the optical part 901 and light output to the third tap 13 are output. The second tap 12 is formed such that a quantity of the output light is larger than the light output to the third tap 13. For example, the second tap 12 is formed such that the output light is ten times larger than the light output to the third tap 13.

The third tap 13 is formed such that the third tap 13 outputs light to the wavelength monitor 16 larger than light output to the power monitoring element 15. For example, the second tap 12 is formed such that the output light is four times larger than the light output to the wavelength monitor 16 and such that light output to the first monitoring element 21, light output to the second monitoring element 22, and light output to the power monitoring element 15 are almost equal.

The ring filter 14 may also be referred to as a ring resonator. A set of the light source 10 and the ring filter 14 forms a resonator whose resonant frequency is controlled depending on an applied temperature. That is, light emitted from the light source 10 is guided to the ring filter 14, and light of a specific wavelength is resonated by the ring filter 14. The light of the specific wavelength is output from the resonator (a set of the light source 10 and the ring filter 14) to the outside of the optical part 901 via the first tap 11 and the second tap 12. In addition, part of the light (of the specific wavelength) is output to the wavelength monitor 16 and the power monitoring element 15 via the first tap 11, the second tap 12, and the third tap 13. The resonant frequency of the resonator formed of the light source 10 and the ring filter 14 is controlled by adjusting a temperature of the ring filter 14. The temperature of the ring filter 14 is adjusted by adjusting a current supplied to a heater placed closely to the ring filter 14, which is formed of a Peltier device. That is, the ring filter 14 acts as a wavelength selecting element for selecting, as the output light, light having a specific wavelength from light emitted from the light source 10, in accordance with a wavelength control signal entered from the control unit (not illustrated). As a configuration of the ring filter 14 is well-known, detailed description of the ring filter 14 will be omitted.

The power monitoring element 15 is a photodiode for example. The power monitoring element 15 receives light via the third tap 13, and outputs a certain amount of current to the control unit (not illustrated), in response to a quantity of the received light.

The wavelength monitor 16 includes the wavelength filter 20, the first monitoring element 21, and the second monitoring element 22. The first monitoring element 21 and the second monitoring element 22 are photodiodes for example, and output a certain amount of respective currents to the control unit (not illustrated), in accordance with a quantity of light received via the wavelength filter 20.

The wavelength filter 20 includes a splitter 30, a first waveguide 31, a second waveguide 32, and a 90-degree hybrid 33. The wavelength filter 20 is a filter having four output ports each of which corresponds to one of four filtering paths of light received via the third tap 13.

The splitter 30 is a 3 dB coupler, for example. The splitter 30 splits light which is output from the third tap 13. The splitter 30 is formed such that a quantity of light output to the first waveguide 31 and a quantity of light output to the second waveguide 32 are equal.

The first waveguide 31 is disposed between the splitter 30 and the 90-degree hybrid 33, and either one of light split by the splitter 30 passes through the first waveguide 31. The second waveguide 32 is disposed between the splitter 30 and the 90-degree hybrid 33, and the other one of the light split by the splitter 30 passes through the second waveguide 32. The second waveguide 32 is longer than the first waveguide 31.

The 90-degree hybrid 33 is an optical branching device employing an MMI (Multi-Mode Interference) waveguide of 4 inputs and 4 outputs which may be referred to as a 4×4 MMI. The 90-degree hybrid 33 is configured such that respective maximum quantities of light (first light P1 to fourth light P4) emitted from a first output port O1, a second output port O2, a third output port O3, and a fourth output port O4 are the same. The 90-degree hybrid 33 multiplexes light input to a first input port I1 via the first waveguide 31 and light input to a third input port I3 via the second waveguide 32, and outputs the multiplexed light to each of the first output port O1, the second output port O2, the third output port O3, and the fourth output port O4. Light is not input to a second input port I2 and a fourth input port I4 in the 90-degree hybrid 33. The first output port O1 and the second output port O2 are provided such that the first output port O1 and the second output port O2 face the first monitoring element 21 and the second monitoring element 22 respectively. As a configuration of the 4×4 MMI is well-known, detailed description of the 4×4 MMI will be omitted.

The wavelength filter 20 acts as a delayed interferometer type filter. A transmittance of light output from each of the first to fourth output ports O1 to O4 varies depending on a wavelength.

FIG. 2 is a graph representing a filtering characteristic of the wavelength filter 20. In FIG. 2, a horizontal axis represents a wavelength of light input to the wavelength filter 20, and a vertical axis represents a transmittance of light output from each of the first to fourth output ports O1 to O4. A waveform 201 represents a transmittance of first light P1 output from the first output port O1, a waveform 202 represents a transmittance of second light P2 output from the second output port O2, a waveform 203 represents a transmittance of third light P3 output from the third output port O3, and a waveform 204 represents a transmittance of fourth light P4 output from the fourth output port O4. Transmittances of the light output from the first to fourth output ports O1 to O4 correspond to respective ratios of a quantity of light output from the first to fourth output ports O1 to O4, to a sum of quantities of the light output from the first to fourth output ports O1 to O4.

In vicinity of a wavelength of 1550 nm indicated by an arrow A in FIG. 2, a gradient of the waveform 201 corresponding to the first light P1 and a gradient of the waveform 204 corresponding to the fourth light P4 becomes the largest, at a point in which a transmittance of the waveforms 201 and 204 is approximately 0.25. That is, in the vicinity of a wavelength of 1550 nm, amounts of change of the transmittances of the first light P1 and the fourth light P4, corresponding to variations of wavelengths, become the largest.

In vicinity of a wavelength of 1551 nm indicated by an arrow B in FIG. 2, a gradient of the waveform 202 corresponding to the second light P2 and a gradient of the waveform 203 corresponding to the third light P3 become the largest, at a point in which a transmittance of the waveforms 202 and 203 is approximately 0.25. That is, in the vicinity of a wavelength of 1551 nm, amounts of change of the transmittances of the second light P2 and the third light P3, corresponding to variations of wavelengths, become the largest.

When a wavelength of the output light is controlled by adjusting a temperature applied to the ring filter 14 based on an amount of change of the transmittance corresponding to a variation of the wavelength, as the amount of change of the transmittance corresponding to a variation of the wavelength becomes larger, the wavelength of the output light can be controlled more precisely. In the vicinity of a wavelength of 1550 nm indicated by the arrow A in FIG. 2, the control unit (not illustrated) adjusts the temperature applied to the ring filter 14 based on a current entered from the first monitoring element 21 receiving the first light P1 whose amount of change of the transmittance corresponding to a variation of the wavelength becomes the largest in the vicinity of a wavelength of 1550 nm. In the vicinity of a wavelength of 1551 nm indicated by the arrow B in FIG. 2, the control unit (not illustrated) adjusts the temperature applied to the ring filter 14 based on a current entered from the second monitoring element 22 receiving the second light P2 whose amount of change of the transmittance corresponding to a variation of the wavelength becomes the largest in the vicinity of a wavelength of 1551 nm. By adjusting a temperature applied to the ring filter 14 based a current received from a monitoring element to which light, whose amount of change of the transmittance corresponding to a variation of the wavelength becomes the largest, is entered, the wavelength of the output light can be controlled precisely.

However, in the optical part 901, because the power monitoring element 15, the first monitoring element 21, and the second monitoring element 22 are separate elements from the substrate 910, it requires additional cost for installing these elements. Also, a size of a package may become larger.

Figure 3:
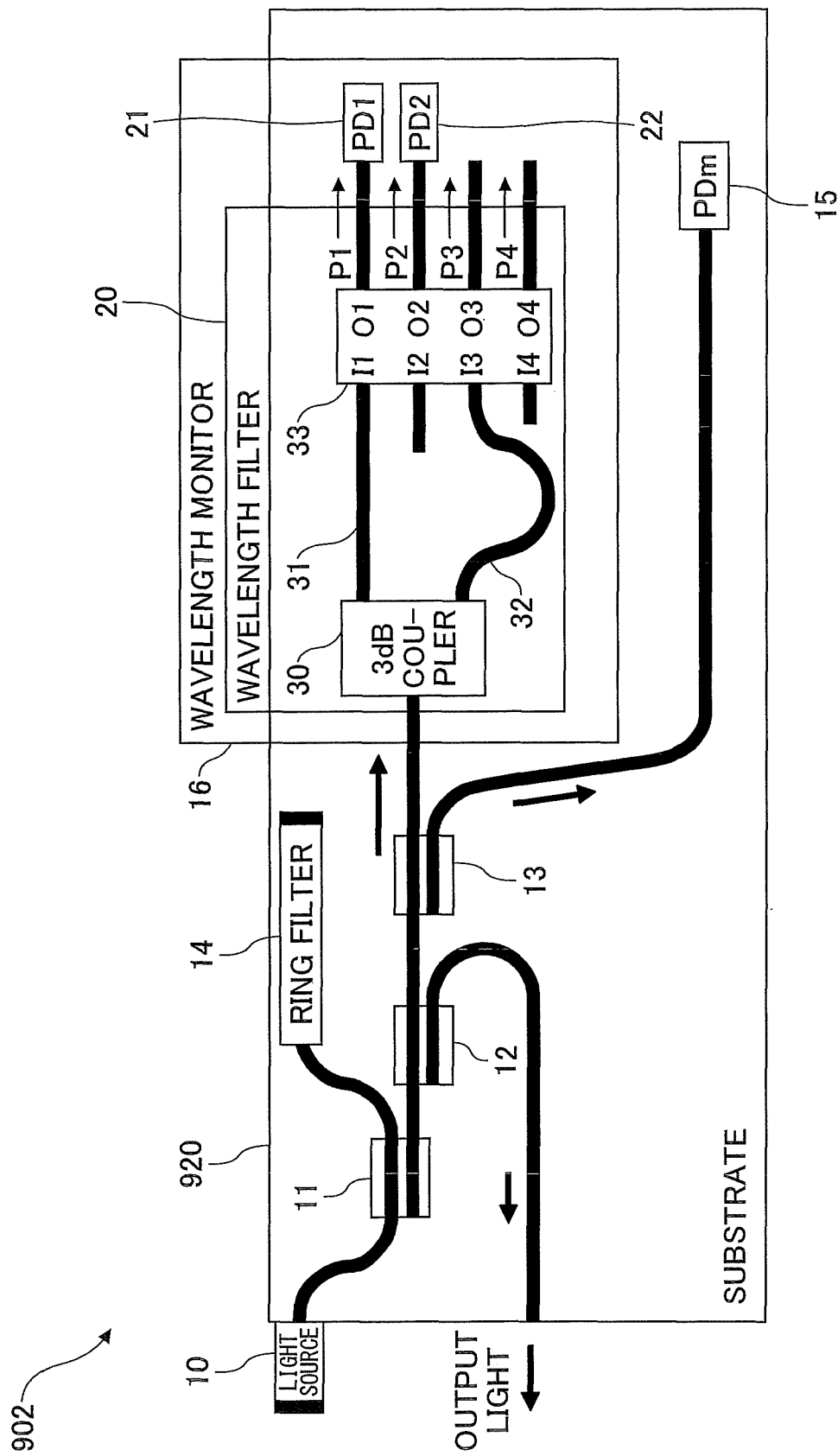
FIG. 3 is a diagram illustrating a second optical part of a tunable optical source according to the related art.

FIG. 3 is a diagram illustrating a second optical part of the related tunable optical source.

An optical part 902 is different from the optical part 901 in that a power monitoring element 15, a first monitoring element 21, and a second monitoring element 22 are installed on a substrate 920. Structures and functions of each element in the optical part 902 are similar to those of the corresponding element in the optical part 901 which has the same reference symbol, except that the power monitoring element 15, the first monitoring element 21, and the second monitoring element 22 are installed on the substrate 920. Accordingly, detailed description of the structures and functions of the elements in the optical part 902 will be omitted here.

In the optical part 902, the power monitoring element 15, the first monitoring element 21, and the second monitoring element 22 may be formed on a surface of the substrate 920. For example, the optical part 902, the power monitoring element 15, the first monitoring element 21, and the second monitoring element 22 may be germanium (Ge) photodiodes formed on the substrate 920.

Figure 4A:
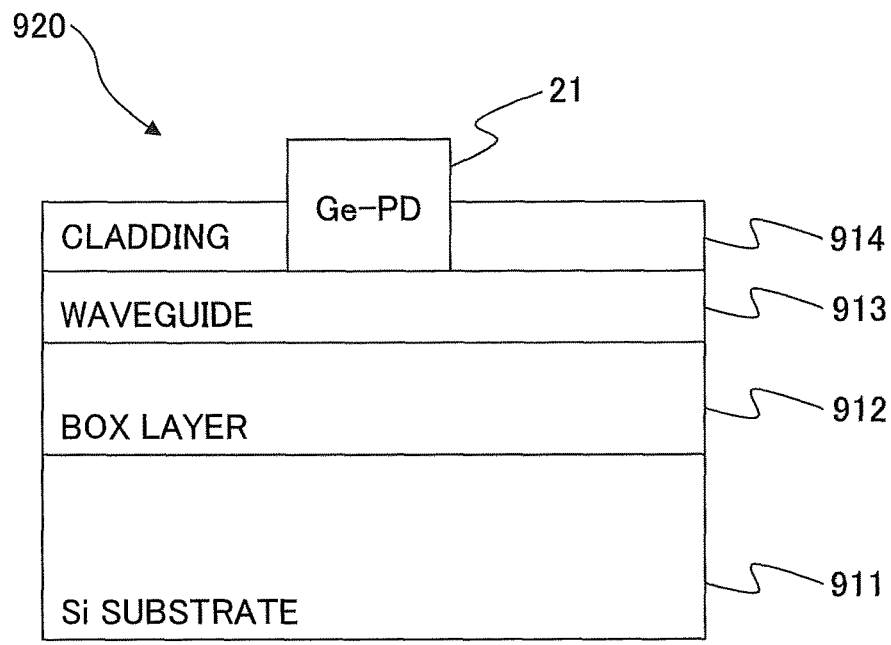
FIG. 4A is a cross-sectional view of a substrate illustrating an example of a state in which a Ge photodiode is formed on the substrate.
Figure 4B:
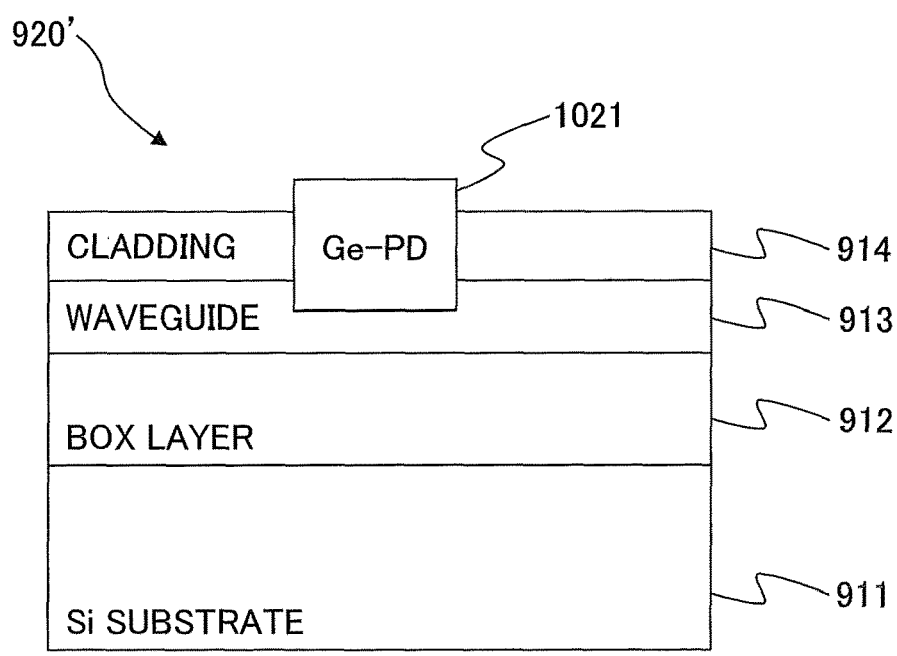
FIG. 4B is a cross-sectional view of a substrate illustrating another example of a state in which a Ge photodiode is formed on the substrate.

FIG. 4A is a cross-sectional view of the substrate 920 illustrating an example of a state in which a Ge photodiode (Ge-PD) is formed on the substrate 920, and FIG. 4B is a cross-sectional view of the substrate 920 illustrating another example (920') of a state in which a Ge photodiode is formed on the substrate 920.

The first monitoring element 21 may be formed such that a bottom surface of the first monitoring element 21 touches an upper surface of the waveguide 913, as illustrated in FIG. 4A, or may be formed such that the bottom surface of the first monitoring element 21 is embedded in the waveguide 913, as illustrated in FIG. 4B. The first monitoring element 21 may be formed of a p-type bottom part silicon pattern, an i-type first germanium pattern, an n-type second germanium pattern, and an n-type upper part silicon pattern. The i-type first germanium pattern, the n-type second germanium pattern, and the n-type upper part silicon pattern are layered on the bottom part silicon pattern sequentially. Alternatively, both the first germanium pattern and the second germanium pattern may be n-type.

As the power monitoring element 15, the first monitoring element 21, and the second monitoring element 22 are installed on the substrate 920 in the optical part 902, a cost of implementing the optical part 902 is less than the optical part 901, and a size of a package becomes smaller.

However, in the optical parts 901 and 902, the light source 10 is disposed at end surfaces of the substrates 910 and 920 respectively, such that light output from the light source 10 is entered to a waveguide extended from the first tap 11. When the light source 10 is to be disposed such that light output from the light source 10 is entered to a waveguide extended from the first tap 11, it is difficult to align the light source 10 with the end surface of the substrate 910 or 920. Therefore, alignment of the light source 10 with the end surface of the substrate 910 or 920 is likely to fail, and a yield rate may decrease.

Figure 5:
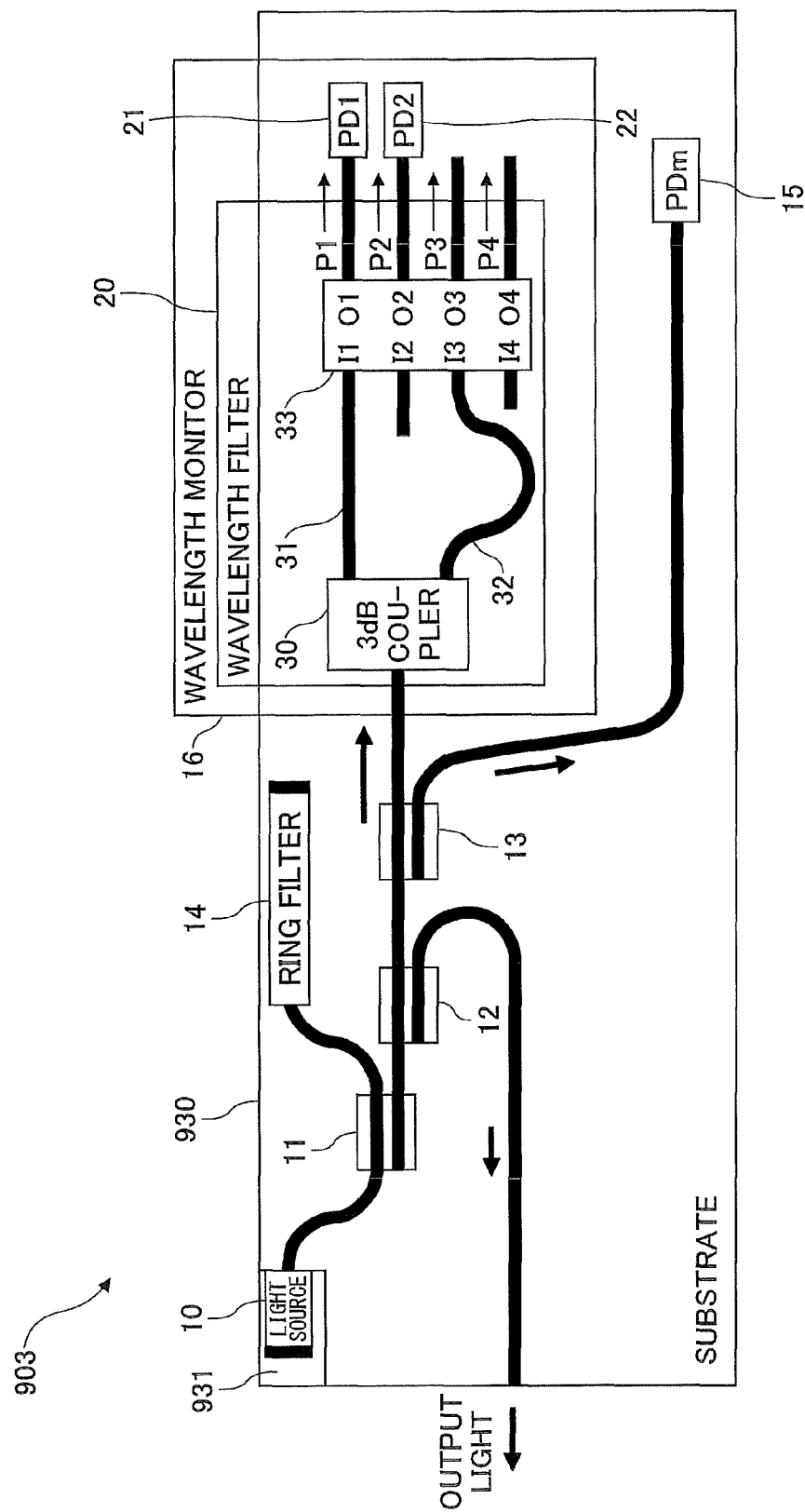
FIG. 5 is a diagram illustrating a third optical part of a tunable optical source according to the related art.

FIG. 5 is a diagram illustrating a third optical part of the related tunable optical source.

An optical part 903 is different from the optical part 902 in that a light source 10 is installed in a recessed terrace 931 formed by excavating a surface of a substrate 930. Structures and functions of each element in the optical part 903 are similar to those of the corresponding element in the optical part 902 having the same reference symbol, except that the light source 10 is installed in the terrace 931. Accordingly, detailed description of the structures and functions of the elements in the optical part 903 will be omitted here.

In forming the terrace 931 in which the light source 10 is installed, if a recess depth is managed precisely, an alignment of the light source 10 with a waveguide extended from the first tap 11 is made easier, and decrease of a yield rate because of frequent occurrence of misalignment can be prevented.

However, in the optical part 903, as the light source 10 is installed in the recessed terrace 931 formed by excavating a surface of the substrate 930, the end surface of the waveguide extended from the first tap 11 is located at a side wall of the terrace 931, not at the end surface of the substrate 930. Because the end surface of the waveguide extended from the first tap 11 is located at a side wall of the terrace 931 in the optical part 903, it is difficult to inspect a power monitoring element 15, a first monitoring element 21, and a second monitoring element 22 in a state in which the light source 10 is not installed. That is, in the optical part 901 or 902, an inspection of the first monitoring element 21 and the second monitoring element 22 can be conducted by inputting light for inspection from the end surface of the waveguide extended from the first tap 11, by using an optical fiber. However, in the optical part 903, as the end surface of the waveguide extended from the first tap 11 is located at the side wall of the terrace 931, it is difficult to input light for inspection to the power monitoring element 15, the first monitoring element 21, and the second monitoring element 22, from the end surface of the waveguide extended from the first tap 11, by using an optical fiber.

<Overview of the Tunable Optical Source According to Embodiments of the Present Disclosure>

Because the tunable optical source according to the present embodiment includes an inspection waveguide, one end of which is connected to a photodetector, and an inspection light input unit for inputting the inspection light which is connected to the other end of the inspection waveguide, the inspection light can be input to the photodetector from the inspection light input unit through the inspection waveguide. As the tunable optical source according to the present embodiment is configured such that the inspection light is input to the photodetector from the inspection light input unit through the inspection waveguide, an inspection of the photodetector, when light from a light source is not used, is made easier.

<Structures and Functions of the Tunable Optical Source According to a First Embodiment>

Figure 6:
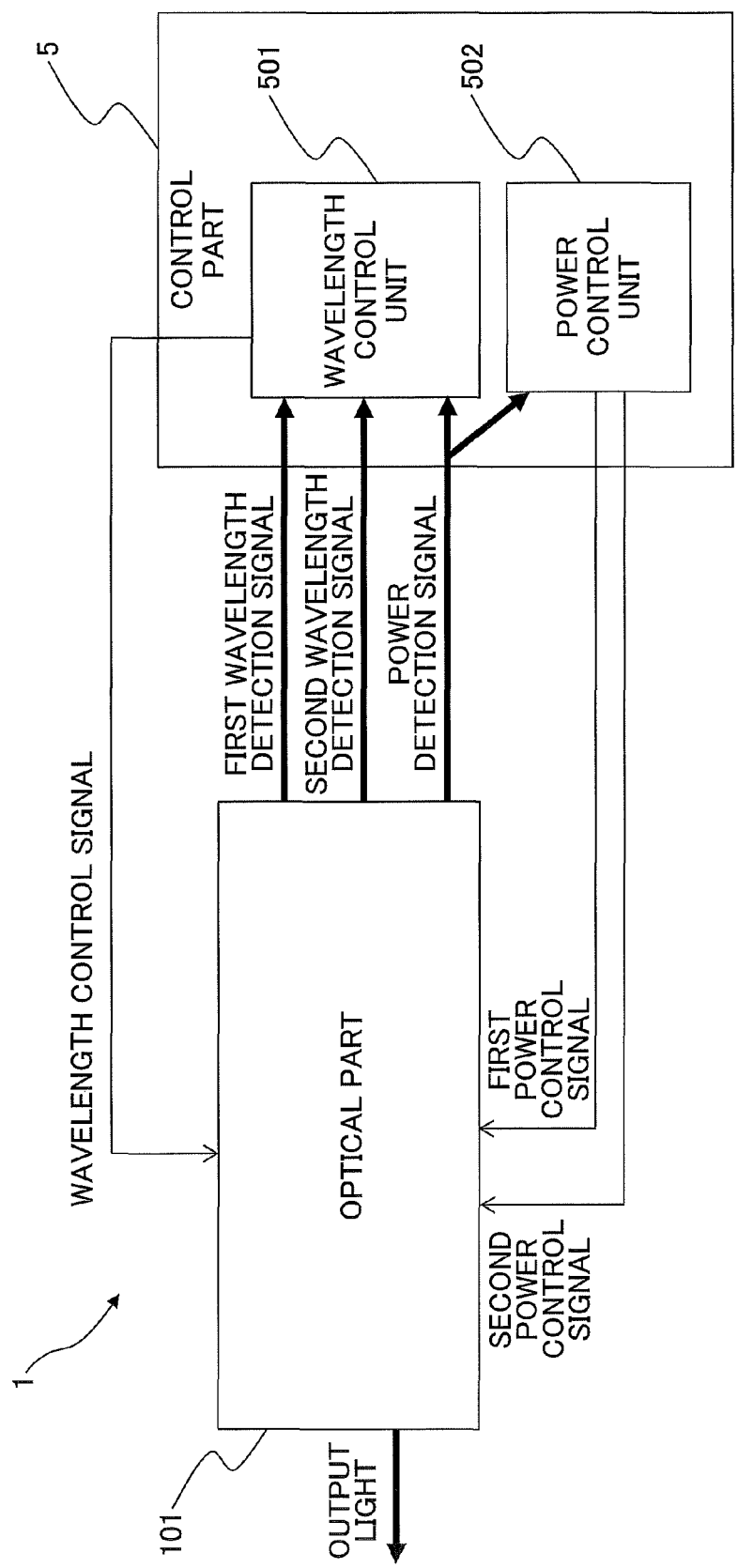
FIG. 6 is a block diagram of a tunable optical source according to a first embodiment.
Figure 7:
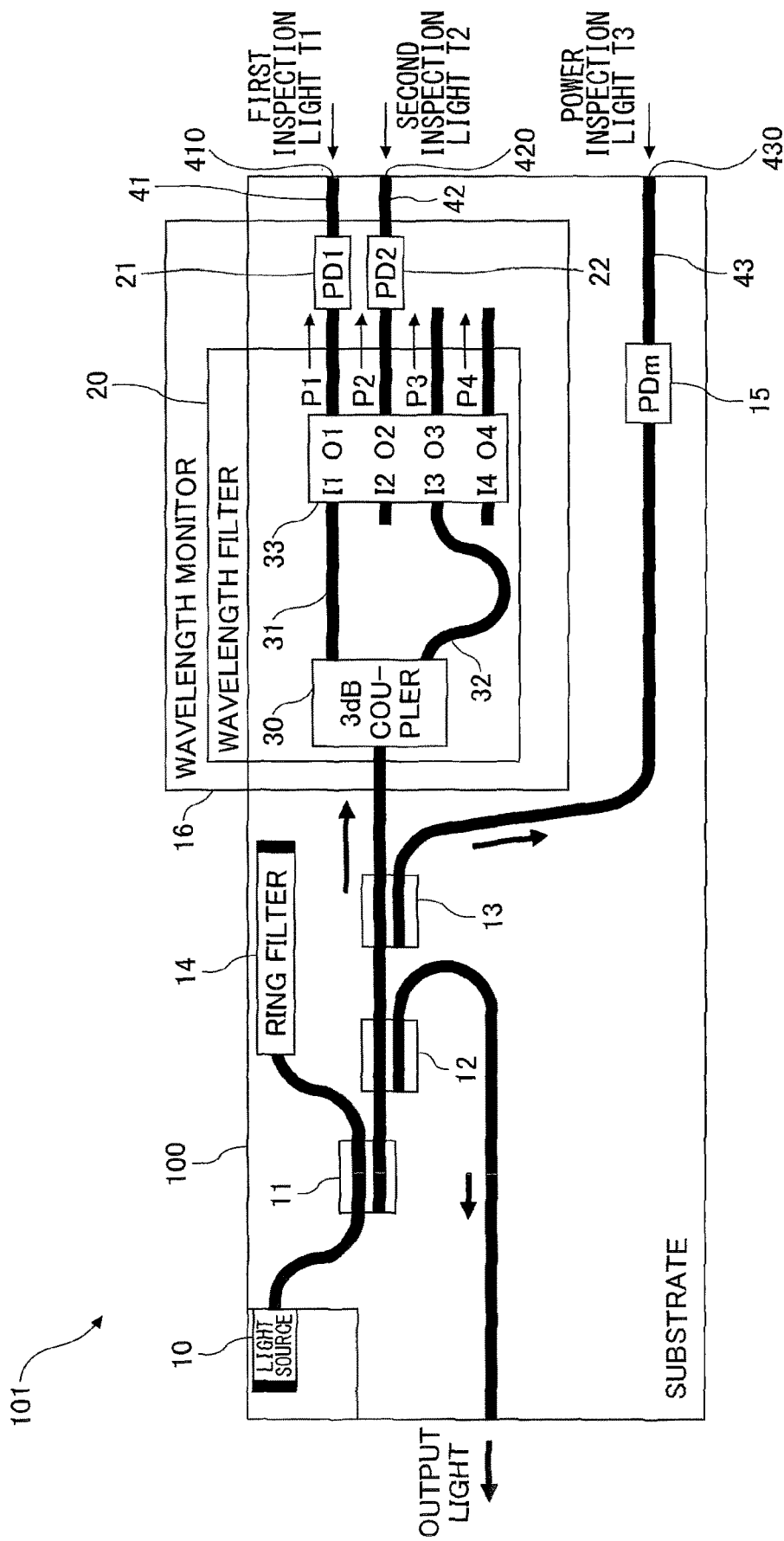
FIG. 7 is an internal block diagram of an optical part illustrated in FIG. 6.

FIG. 6 is a block diagram of a tunable optical source according to a first embodiment, and FIG. 7 is a block diagram illustrating an inside of an optical part illustrated in FIG. 6.

The tunable optical source 1 includes an optical part 101 and a control part 5. The optical part 101 is different from the optical part 903 in that the optical part 101 includes a first inspection waveguide 41, a second inspection waveguide 42, and an optical output power inspection waveguide 43. Structures and functions of each element in the optical part 101 are similar to those of the corresponding element in the optical part 903 which has the same reference symbol, except the first inspection waveguide 41, the second inspection waveguide 42, and the optical output power inspection waveguide 43. Accordingly, detailed description of the structures and functions of the elements in the optical part 101 will be omitted here.

The first inspection waveguide 41 is an optical waveguide. One end of the first inspection waveguide 41 is connected to a first monitoring element 21 and the other end is in contact with an end surface of a substrate 100. A first inspection light input unit 410 is located at the other end of the first inspection waveguide 41, and a first inspection light T1 for inspecting the first monitoring element 21 is entered from the first inspection light input unit 410.

The second inspection waveguide 42 is an optical waveguide. One end of the second inspection waveguide 42 is connected to a second monitoring element 22 and the other end is in contact with an end surface of the substrate 100. A second inspection light input unit 420 is located at the other end of the second inspection waveguide 42, and a second inspection light T2 for inspecting the second monitoring element 22 is entered from the second inspection light input unit 420.

The optical output power inspection waveguide 43 is an optical waveguide. One end of the optical output power inspection waveguide 43 is connected to a power monitoring element 15 and the other end is in contact with an end surface of the substrate 100. An optical output power inspection light input unit 430 is located at the other end of the optical output power inspection waveguide 43, and an optical output power inspection light T3 (may also be referred to as a "power inspection light T3") for inspecting the power monitoring element 15 is entered from the optical output power inspection light input unit 430.

The control part 5 is, for example, formed of logic gates formed by CMOS transistors formed on the substrate, and is formed of memory circuits formed of flash memories or the like. The control part 5 includes a wavelength control unit 501 and a power control unit 502.

Figure 8:
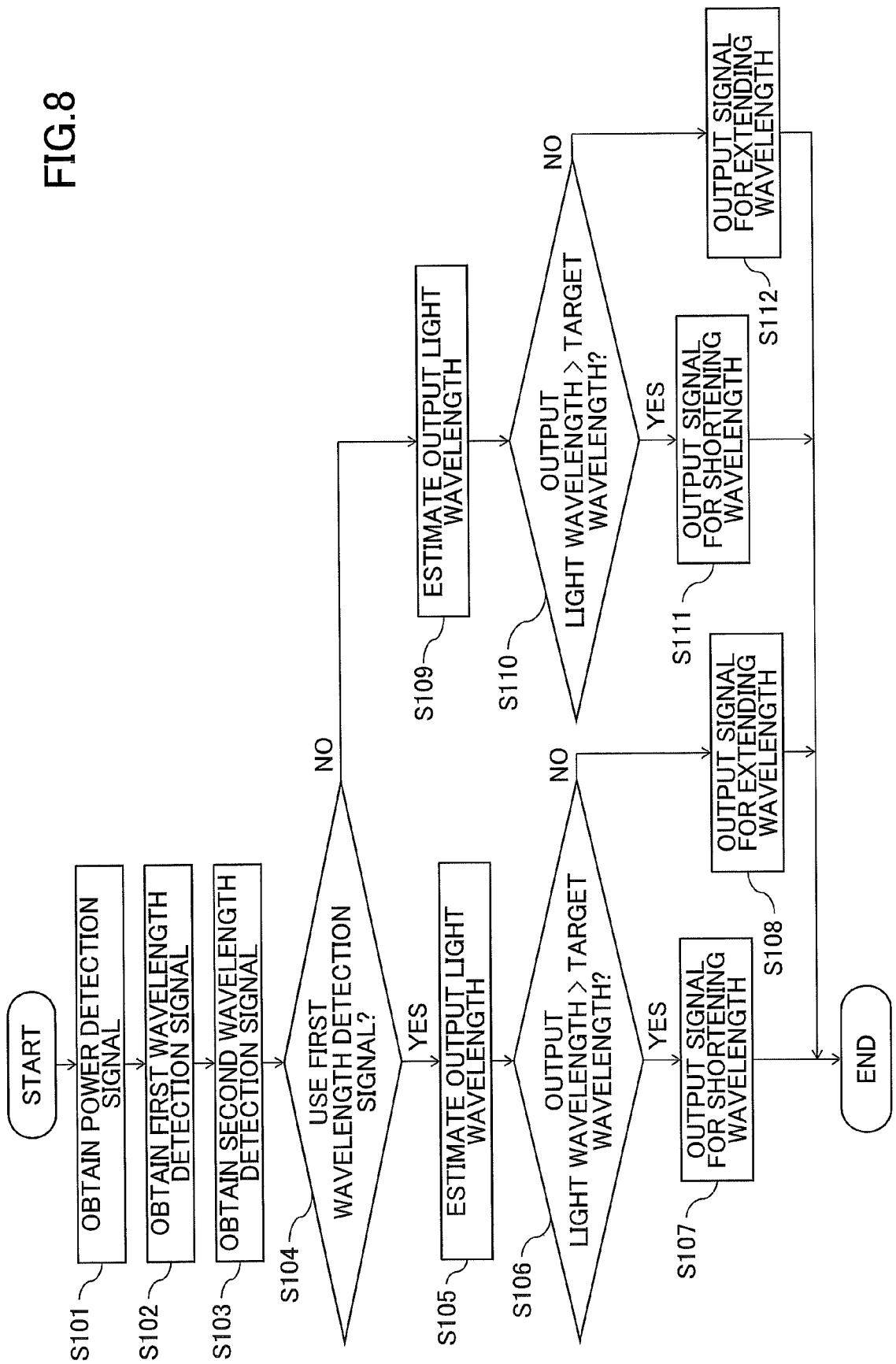
FIG. 8 is a flowchart illustrating a flow of a wavelength control process performed by a wavelength control unit illustrated in FIG. 6.

FIG. 8 is a flowchart illustrating a flow of a wavelength control process performed by the wavelength control unit 501. The wavelength control process illustrated in FIG. 8 is executed by logic circuits forming the wavelength control unit 501.

First, the wavelength control unit 501 obtains, from the optical part 101, an optical output power detection signal (may also be referred to as a "power detection signal") represented by an amount of current supplied from the power monitoring element 15 in accordance with a quantity of light that enters the power monitoring element 15 via the third tap 13 (a part of the output light emitted from the ring resonator (a set of the light source and the ring filter 14)) (S101). Next, the wavelength control unit 501 obtains, from the optical part 101, a first wavelength detection signal represented by an amount of current supplied from the first monitoring element 21 in accordance with a quantity of first light P1 (S102). Next, the wavelength control unit 501 obtains, from the optical part 101, a second wavelength detection signal represented by an amount of current supplied from the second monitoring element 22 in accordance with a quantity of second light P2 (S103).

Next, the wavelength control unit 501 determines which current to be used for the wavelength control process, the current corresponding to the first wavelength detection signal or the current corresponding to the second wavelength detection signal (S104). Based on a target wavelength that is stored in the memory circuit, the wavelength control unit 501 determines which current to be used for the wavelength control process, the current corresponding to the first wavelength detection signal or the current corresponding to the second wavelength detection signal. For example, if the target wavelength is 1549.8 nm indicated by the arrow A in FIG. 2, the wavelength control unit 501 determines that the wavelength control unit 501 uses, for the wavelength control process, the first wavelength detection signal received from the first monitoring element 21 which receives light whose amount of change of the transmittance corresponding to a variation of the wavelength is larger. Further, if the target wavelength is 1551 nm indicated by the arrow B in FIG. 2, the wavelength control unit 501 determines that the wavelength control unit 501 uses, for the wavelength control process, the second wavelength detection signal received from the second monitoring element 22 which receives light whose amount of change of the transmittance corresponding to a variation of the wavelength is larger.

If the wavelength control unit 501 determines that the wavelength control unit 501 uses, for the wavelength control process, the current corresponding to the first wavelength detection signal (S104—YES), the wavelength control unit 501 estimates a wavelength of the output light output from the optical part 101, by using the current corresponding to the first wavelength detection signal (S105). The wavelength control unit 501 estimates the wavelength of the output light output from the optical part 101, based on a ratio of the current corresponding to the first wavelength detection signal obtained at S102, to the current corresponding to the power detection signal obtained at S101. For example, the wavelength control unit 501 estimates the wavelength of the output light, by collating the ratio of the current obtained at S102 to the current obtained at S101, with a table recording a relation between the current ratio and a wavelength.

Next, the wavelength control unit 501 determines if the wavelength of the output light estimated at S105 is longer than the target wavelength stored in the memory circuit (S106).

If it is determined that the wavelength of the output light is longer than the target wavelength (S106—YES), the wavelength control unit 501 outputs, to the optical part 101, a wavelength control signal indicating that the wavelength of the output light should be shortened (S107). In response to receiving the wavelength control signal, a heater (not illustrated) in the optical part 101 adjusts a temperature of a ring filter 14 to shorten the wavelength of the output light.

If it is determined that the wavelength of the output light is shorter than the target wavelength (S106—NO), the wavelength control unit 501 outputs, to the optical part 101, a wavelength control signal indicating that the wavelength of the output light should be lengthened (S108). In response to receiving the wavelength control signal, the heater (not illustrated) in the optical part 101 adjusts a temperature of the ring filter 14 to lengthen the wavelength of the output light.

If the wavelength control unit 501 determines that the wavelength control unit 501 uses, for the wavelength control process, the current corresponding to the second wavelength detection signal (S104—NO), the wavelength control unit 501 estimates the wavelength of the output light output from the optical part 101, by using the current corresponding to the second wavelength detection signal (S109). The wavelength control unit 501 estimates the wavelength of the output light output from the optical part 101, based on a ratio of the current corresponding to the second wavelength detection signal obtained at S103, to the current corresponding to the power detection signal obtained at S101. For example, the wavelength control unit 501 estimates the wavelength of the output light, by collating the ratio of the current obtained at S103 to the current obtained at S101, with a table recording a relation between the current ratio and a wavelength.

Next, the wavelength of the output light is determined. The wavelength control unit 501 determines if the wavelength of the output light estimated at S109 is longer than the target wavelength stored in the memory circuit (S110).

If it is determined that the wavelength of the output light is longer than the target wavelength (S110—YES), the wavelength control unit 501 outputs, to the optical part 101, the wavelength control signal indicating that the wavelength of the output light should be shortened (S111). In response to receiving the wavelength control signal, the heater (not illustrated) in the optical part 101 adjusts a temperature of the ring filter 14 to shorten the wavelength of the output light.

If it is determined that the wavelength of the output light is shorter than the target wavelength (S110—NO), the wavelength control unit 501 outputs, to the optical part 101, the wavelength control signal indicating that the wavelength of the output light should be lengthened (S112). In response to receiving the wavelength control signal, the heater (not illustrated) in the optical part 101 adjusts a temperature of the ring filter 14 to lengthen the wavelength of the output light.

The power control unit 502 obtains, from the optical part 101, the power detection signal represented by the amount of current supplied from the power monitoring element 15 in accordance with the quantity of light that enters the power monitoring element 15 via the third tap 13 (a part of the output light emitted from the ring resonator (a set of the light source and the ring filter 14)), and the power control unit 502 controls the quantity of the output light based on the amount of current obtained. For example, the power control unit 502 determines the quantity of the output light based on the amount of current corresponding to the power detection signal and a table stored in the memory circuit that retains a relation between a current and a quantity of light. Subsequently, the power control unit 502 compares the quantity of the output light corresponding to the power detection signal with a target quantity of light stored in the memory circuit.

If the quantity of the output light corresponding to the power detection signal is larger than the target quantity of light, the power control unit 502 outputs, to the optical part 101, a first optical output power control signal (may also be referred to as a a "first power control signal") and a second optical output power control signal (may also be referred to as a "second power control signal") indicating that a quantity of the output light should decrease. If the quantity of the output light corresponding to the power detection signal is less than the target quantity of light, the power control unit 502 outputs, to the optical part 101, the first power control signal and the second power control signal indicating that a quantity of the output light should increase.

The first power control signal is, for example, current supplied to the light source 10 in the optical part 101, and the second power control signal is, for example, current supplied to an amplifier (not illustrated) in the optical part 101. The power control unit 502 may control the quantity of the output light by outputting the first power control signal and the second power control signal alternately. Alternatively, the power control unit 502 may control the quantity of the output light by changing the current corresponding to the first power control signal and the current corresponding to the second power control signal at a given rate.

<Effect of the Tunable Optical Source According to the First Embodiment>

Because the tunable optical source according to the first embodiment includes an inspection waveguide, one end of which is connected to a photodetector for monitoring a wavelength that is installed on a substrate with a light source, and the other end of which is in contact with an end surface of the substrate, inspection light for the photodetector can be input to the photodetector from an inspection light input unit provided at the end surface of the substrate. As the tunable optical source according to the first embodiment is configured such that the inspection light is input to the photodetector from the inspection light input unit through the inspection waveguide, an inspection of the photodetector, when light from a light source is not used, can be made easier.

Because the tunable optical source according to the first embodiment also includes an optical output power inspection waveguide, one end of which is connected to a photodetector for optical output power and the other end of which is in contact with the end surface of the substrate, inspection light for the photodetector for optical output power can be input to the photodetector for optical output power from an optical output power inspection light input unit provided at the end surface of the substrate. As the tunable optical source according to the first embodiment is configured such that the inspection light for the photodetector for optical output power is input to the photodetector for optical output power from the optical output power inspection light input unit through the optical output power inspection waveguide, an inspection of the photodetector, when light from a light source is not used, can be made easier.

<Structures and Functions of the Tunable Optical Source According to a Second Embodiment>

Figure 9:
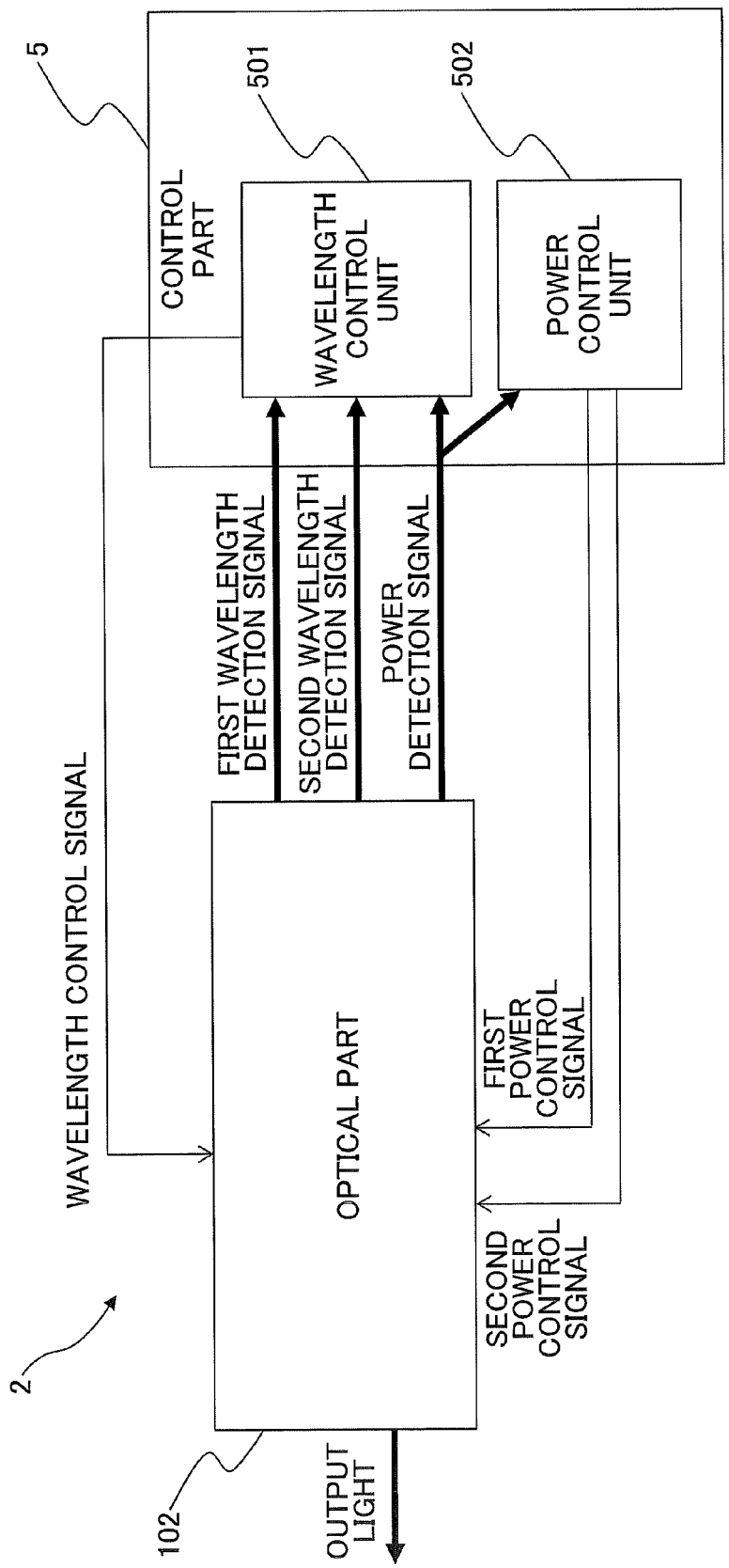
FIG. 9 is a block diagram of a tunable optical source according to a second embodiment.
Figure 10:
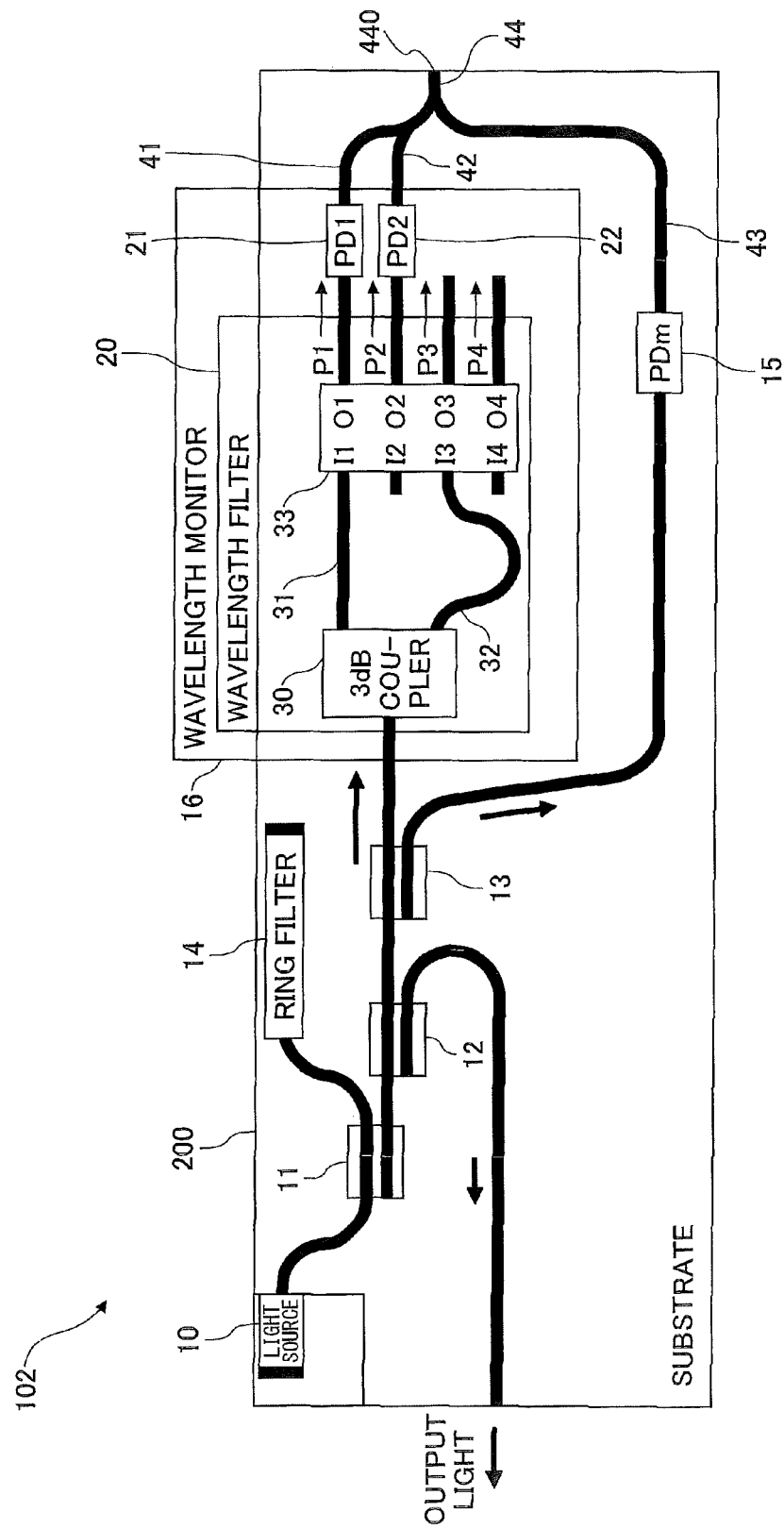
FIG. 10 is a block diagram illustrating an inside of an optical part illustrated in FIG. 9.

FIG. 9 is a block diagram of a tunable optical source according to a second embodiment, and FIG. 10 is a block diagram illustrating an inside of an optical part illustrated in FIG. 9.

The tunable optical source 2 includes an optical part 102 and a control part 5. The optical part 102 is different from the optical part 101 in that the optical part 102 includes a splitter 44. As structures and functions of each element in the optical part 102 are similar to those of the corresponding element in the optical part 101 having the same reference symbol, except the splitter 44, detailed description of the structures and functions of the elements will be omitted here.

The splitter 44 splits inspection light entered from an inspection light input unit 440 located at an end surface of a substrate 200, into three inspection light beams, which are output to a first inspection waveguide 41, a second inspection waveguide 42, and an optical output power inspection waveguide 43, respectively. For example, the splitter 44 is configured such that each quantity of the three inspection light beams split by the splitter 44 is the same.

<Effect of the Tunable Optical Source According to the Second Embodiment>

The tunable optical source according to the second embodiment includes a splitter for splitting inspection light into multiple inspection light beams and for outputting the inspection light beams to respective optical waveguides. Accordingly, in the tunable optical source according to the second embodiment, because multiple photodetectors can be inspected simultaneously only by inputting a single beam of inspection light into an inspection light input unit, efficiency of inspection can be improved.

<Structures and Functions of the Tunable Optical Source According to a Third Embodiment>

Figure 11:
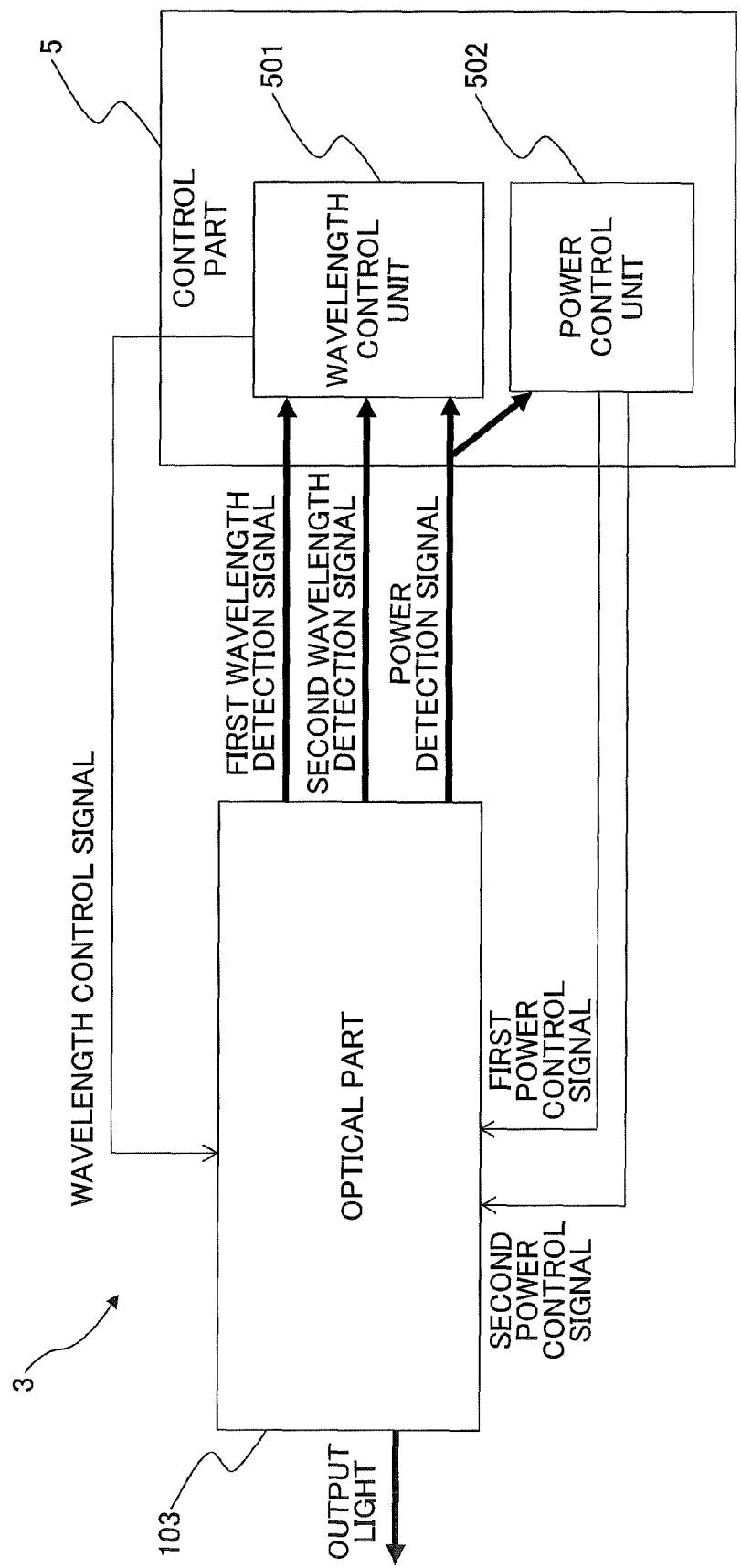
FIG. 11 is a block diagram of a tunable optical source according to a third embodiment.
Figure 12:
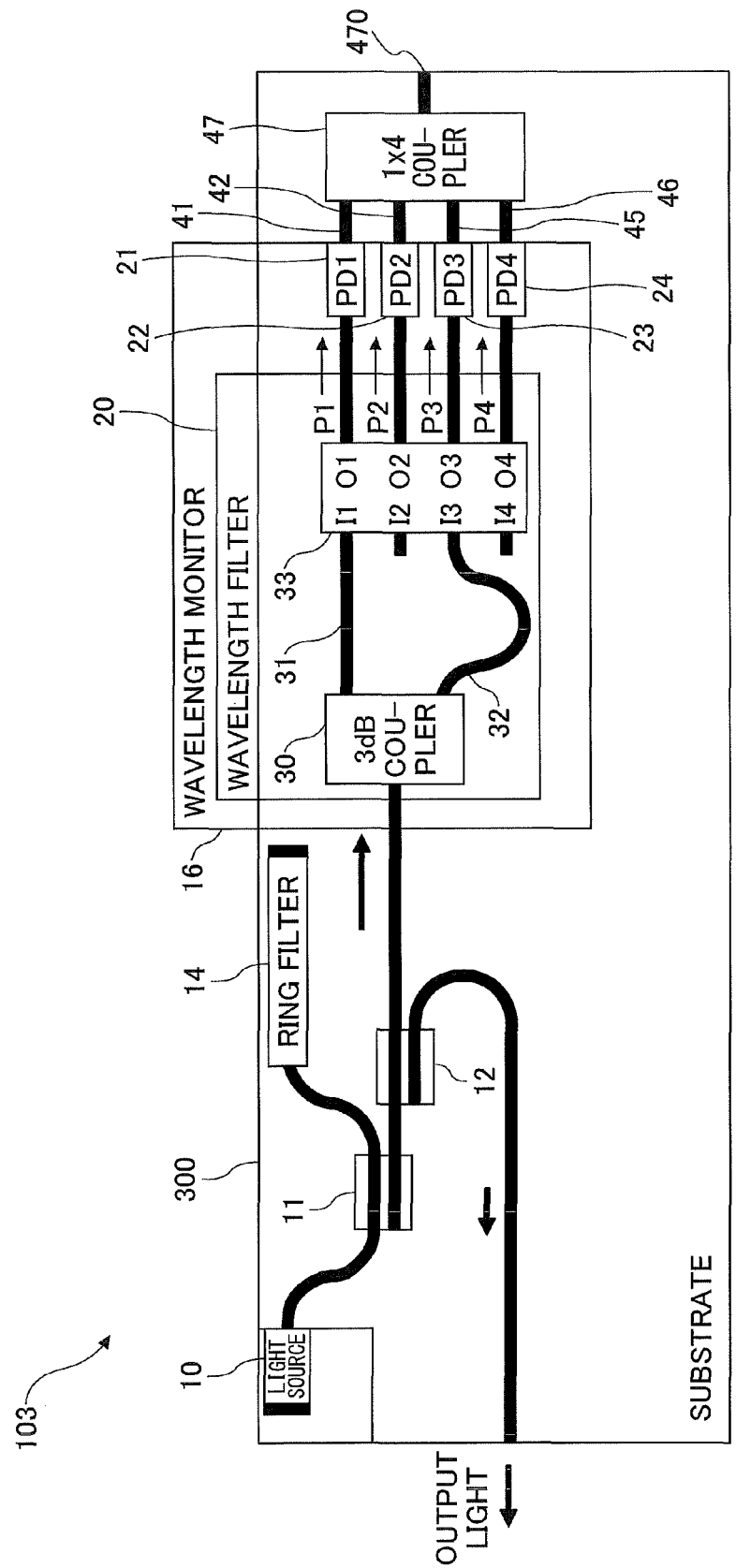
FIG. 12 is a block diagram illustrating an inside of an optical part illustrated in FIG. 11.

FIG. 11 is a block diagram of a tunable optical source according to a third embodiment, and FIG. 12 is a block diagram illustrating an inside of an optical part illustrated in FIG. 11.

The tunable optical source 3 includes an optical part 103 and a control part 5. The optical part 103 is different from the optical part 101 in that the optical part 103 includes a third monitoring element 23, a fourth monitoring element 24, a third inspection waveguide 45, a fourth inspection waveguide 46, and a 1×4 coupler 47. As structures and functions of each element in the optical part 103 are similar to those of the corresponding element in the optical part 101 having the same reference symbol, except the third monitoring element 23, the fourth monitoring element 24, the third inspection waveguide 45, the fourth inspection waveguide 46, and the 1×4 coupler 47, detailed description of the structures and functions of the elements will be omitted here.

The third monitoring element 23 and the fourth monitoring element 24 are photodiodes, for example. The third monitoring element 23 and the fourth monitoring element 24 are provided such that the third monitoring element 23 and the fourth monitoring element 24 face the third output port O3 and the fourth output port O4 of the 90-degree hybrid 33 respectively.

The third inspection waveguide 45 is an optical waveguide, which is connected to the third monitoring element 23 at one end and is connected to an output port of the 1×4 coupler 47 at the other end. Inspection light that is output from the 1×4 coupler 47 is entered to the third monitoring element 23 through the third inspection waveguide 45. The fourth inspection waveguide 46 is an optical waveguide for transmitting inspection light output from the 1×4 coupler 47 to the fourth monitoring element 24, which is connected to the fourth monitoring element 24 at one end and which is connected to another output port of the 1×4 coupler 47 at the other end.

The 1×4 coupler 47 splits inspection light entered from an inspection light input unit 470 located at an end surface of a substrate 300, into four inspection light beams, each of which is output to the first inspection waveguide 41, the second inspection waveguide 42, the third inspection waveguide 45, and the fourth inspection waveguide 46, respectively. For example, the 1×4 coupler 47 is configured such that each quantity of the four inspection light beams split by the 1×4 coupler 47 is the same.

In the tunable optical source 3, instead of monitoring a quantity of light by the power monitoring element 15 as in the tunable optical source 1 or 2, a sum of quantities of light output from the first inspection waveguide 41, the second inspection waveguide 42, the third inspection waveguide 45, and the fourth inspection waveguide 46 is used, as an alternative of the quantity of light by the power monitoring element 15 in the tunable optical source 1 or 2.

<Effect of the Tunable Optical Source According to the Third Embodiment>

Because the tunable optical source according to the third embodiment measures a quantity of output light by using light output from four output ports of the 90-degree hybrid, the power monitoring element 15 that is present in other embodiments such as the first embodiment can be omitted.

<Structures and Functions of the Tunable Optical Source According to a Fourth Embodiment>

Figure 13:
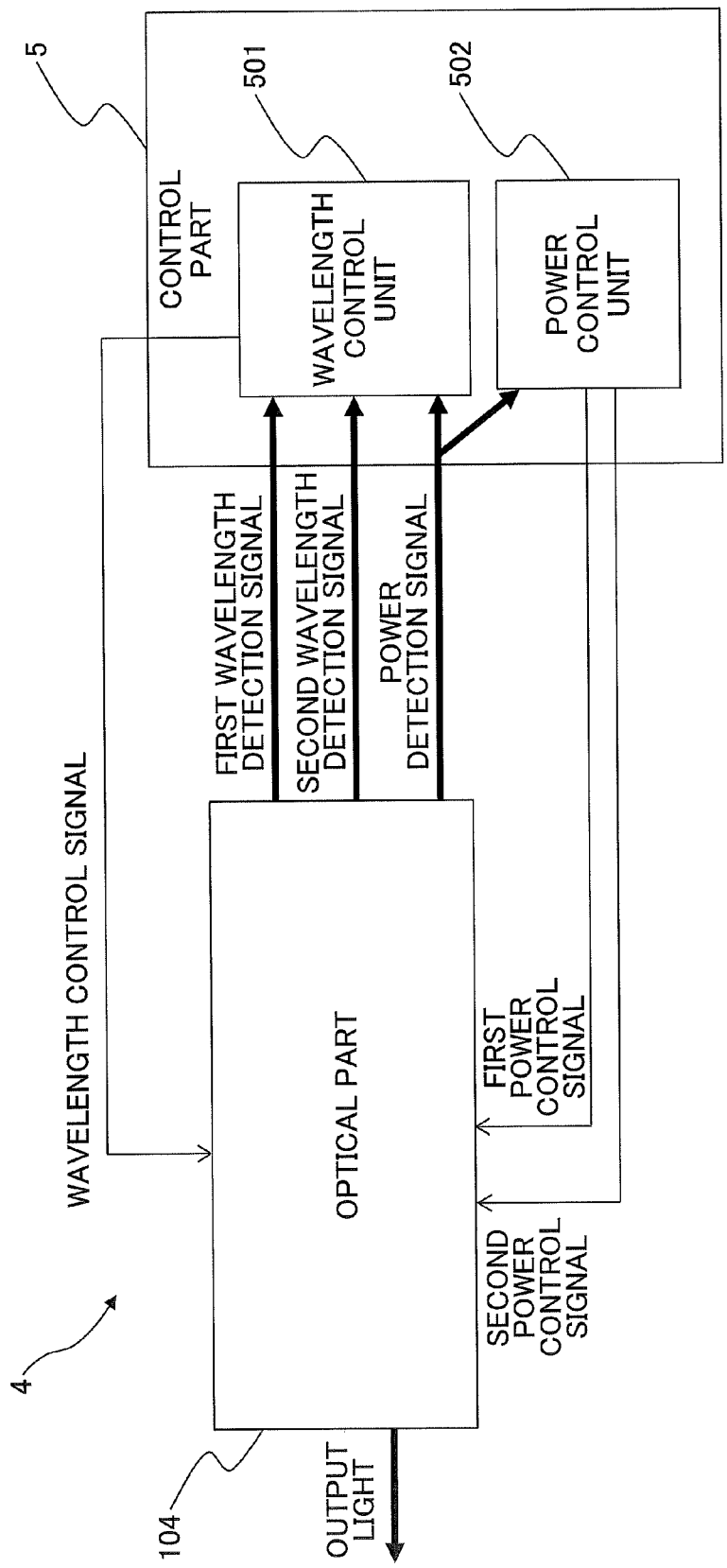
FIG. 13 is a block diagram of a tunable optical source according to a fourth embodiment.
Figure 14:
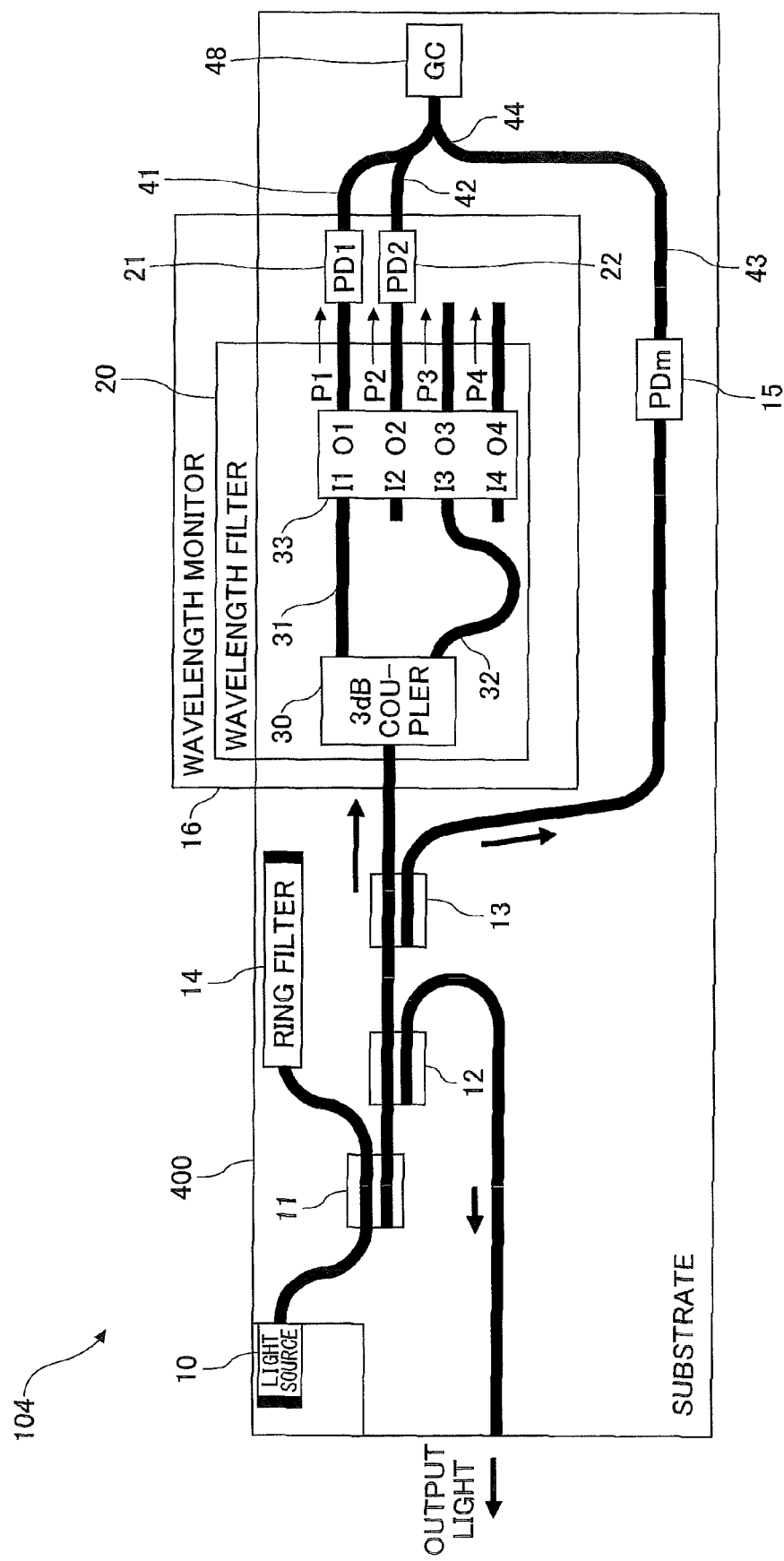
FIG. 14 is a block diagram illustrating an inside of an optical part illustrated in FIG. 13.

FIG. 13 is a block diagram of a tunable optical source according to a fourth embodiment, and FIG. 14 is a block diagram illustrating an inside of an optical part illustrated in FIG. 13.

The tunable optical source 4 includes an optical part 104 and a control part 5. The optical part 104 is different from the optical part 102 in that the optical part 104 includes a grating coupler 48. As structures and functions of each element in the optical part 104 other than the grating coupler 48 are similar to those of the corresponding element in the optical part 102 having the same reference symbol, detailed description of the structures and functions of the elements will be omitted here. In the following description, a case in which the optical part 104 in the fourth embodiment is formed by installing the grating coupler 48 on the substrate 200 of the optical part 102 (in the second embodiment) is described. However, the optical part 104 may be formed by installing a grating coupler on the substrate 100 of the optical part 101 in the first embodiment, or by installing a grating coupler on the substrate 300 of the optical part 103 in the third embodiment.

The grating coupler 48 outputs inspection light which is entered from above a substrate 400, to a splitter 44. The splitter 44 splits the inspection light entered from above the substrate 400 through the grating coupler 48, and outputs the split light.

<Effect of the Tunable Optical Source According to the Fourth Embodiment>

According to the fourth embodiment, because inspection light can be input to the tunable optical source from above the substrate, inspection of photodetectors can be performed before the substrate has been cut off from a wafer.

<Application Example of the Tunable Optical Source According to the Embodiments>

Figure 15:
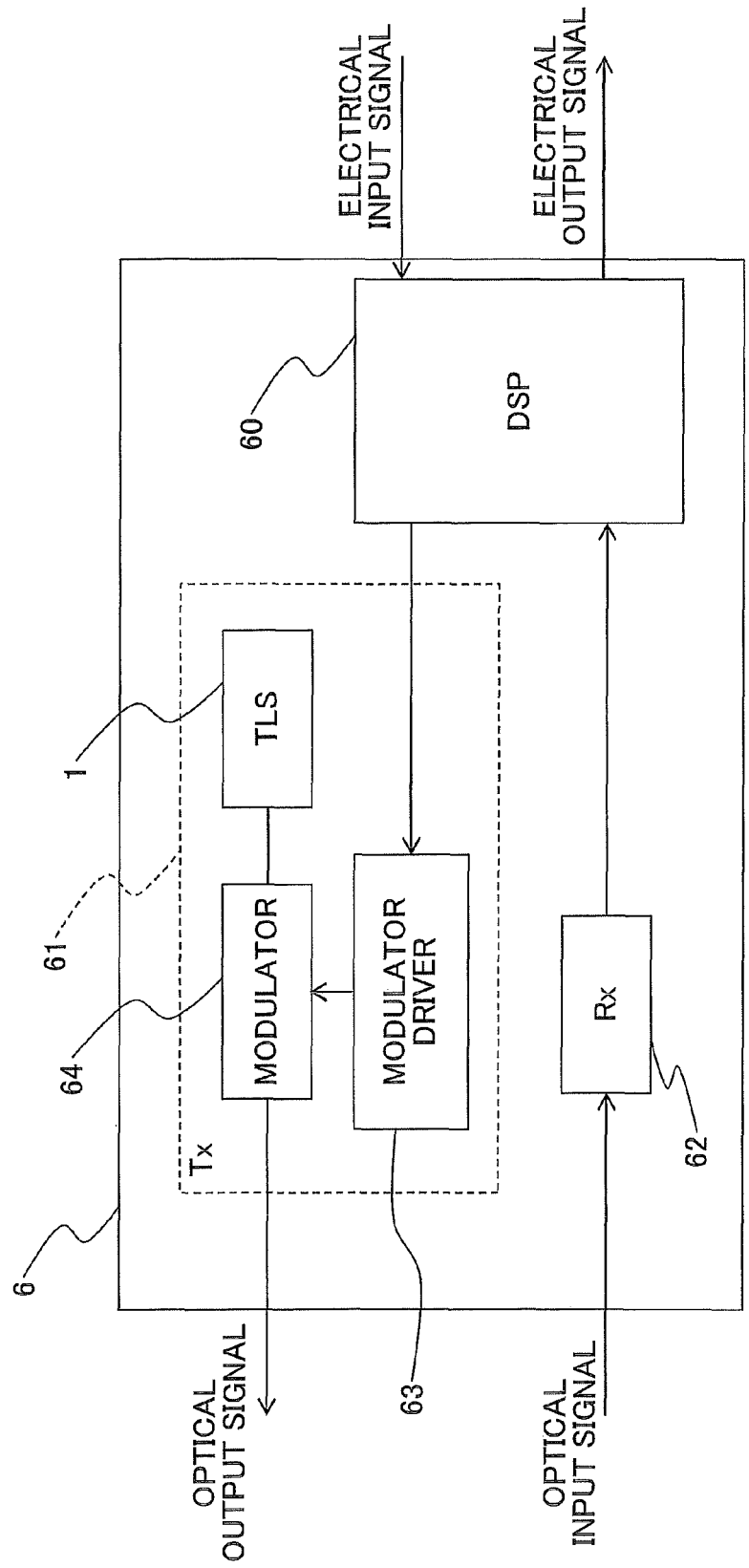
FIG. 15 is a block diagram of an optical module including a tunable optical source according to the embodiments.

FIG. 15 is a block diagram of an optical module including a tunable optical source according to the above described embodiments.

The optical module 6 includes a DSP (Digital Signal Processor) 60, a transmitter 61, and a receiver 62. Note that the transmitter 61 and the receiver 62 are respectively denoted by "Tx" and "Rx". The transmitter 61 includes the tunable optical source 1, a modulator driver 63, and an optical modulator 64 (may simply be referred to as a "modulator 64"). In the present example, the tunable optical source 1 is included in the optical module 6. However, the optical module 6 may include any of the tunable optical sources 2, 3, and 4, instead of the tunable optical source 1.

The DSP 60 receives data represented as an electrical signal (hereinafter referred to as an electrical input signal), applies a predetermined process to the data, and outputs the processed data to the modulator driver 63 in a form of an electrical signal. The DSP 60 also receives data represented as an electrical signal from the receiver 62, applies a predetermined process to the data, and outputs the processed data in a form of an electrical signal (may also be referred to as an electrical output signal).

The modulator driver 63 outputs the electrical signal received from the DSP 60 to the optical modulator 64. The optical modulator 64 modulates light (output light) that the tunable optical source 1 outputs, based on the electrical signal received via the modulator driver 63, and outputs the modulated light as an optical output signal. For example, the optical modulator 64 applies DP-QPSK (Dual Polarization Quadrature Phase Shift Keying) modulation to the output light, to generate the modulated light.

<Structures and Functions of an Inspection Apparatus for Inspecting the Photodetector in the Tunable Optical Source According to the Embodiments>

Figure 16A:
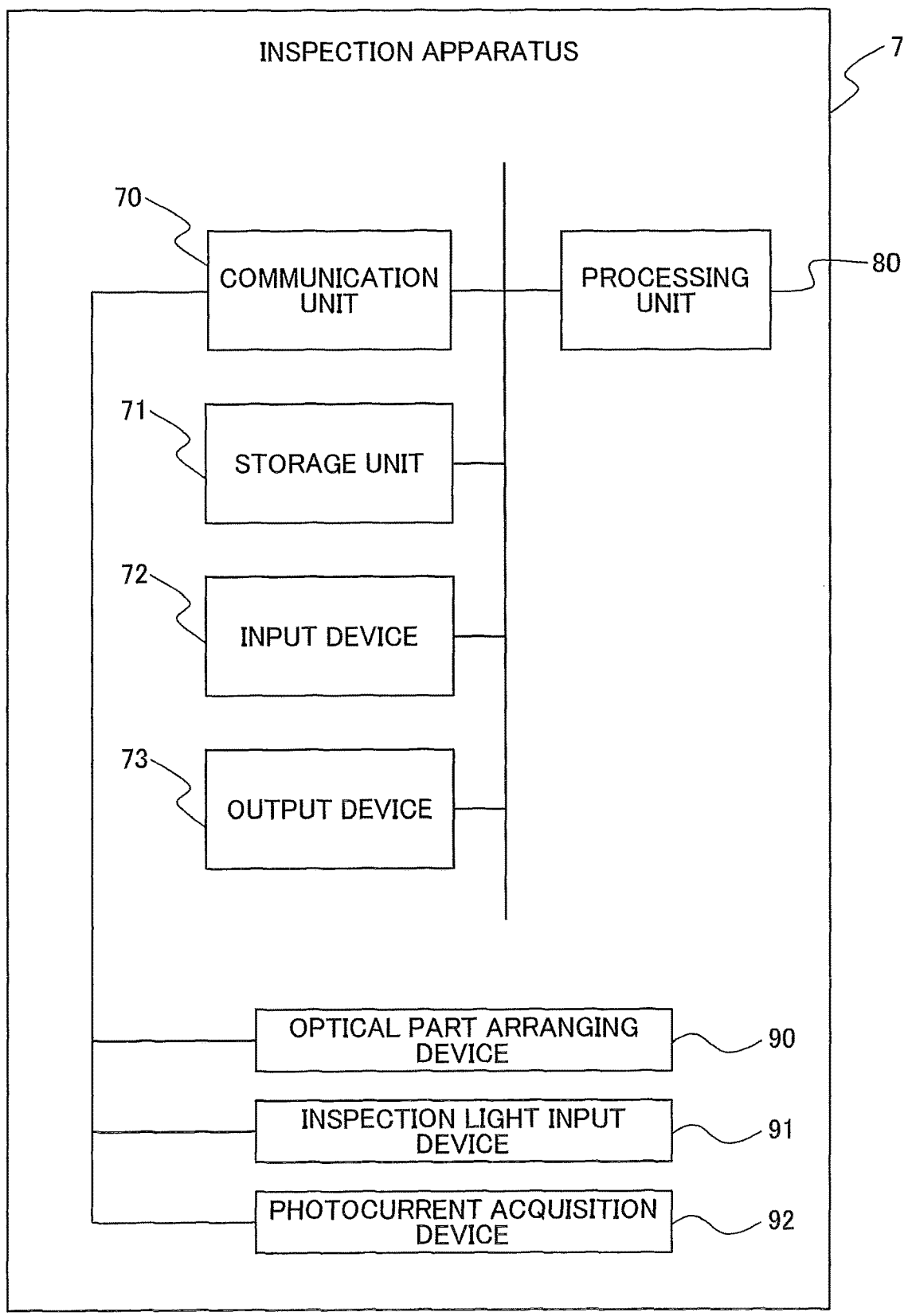
FIG. 16A is a diagram illustrating a hardware configuration of an inspection apparatus for inspecting a photodetector in the tunable optical source according to the embodiments.
Figure 16B:
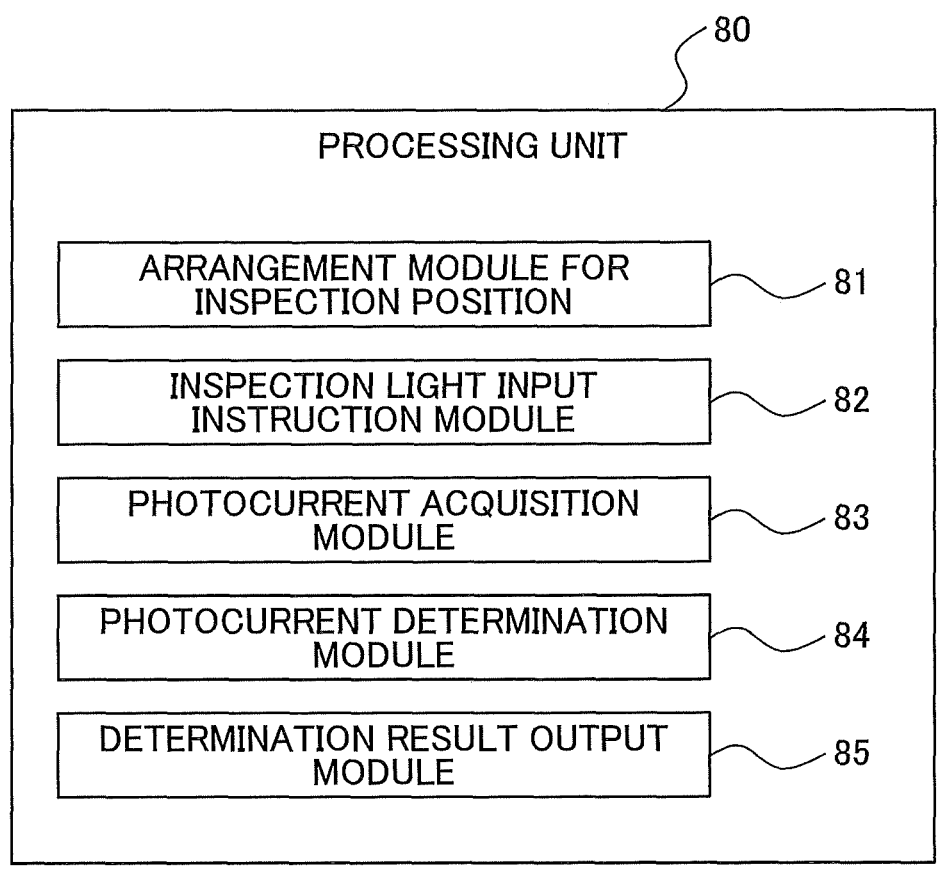
FIG. 16B is a functional block diagram of a processing unit illustrated in FIG. 16A.

FIG. 16A is a diagram illustrating a hardware configuration of an inspection apparatus for inspecting the photodetector in the tunable optical source according to the above described embodiments, and FIG. 16B is a functional block diagram of a processing unit illustrated in FIG. 16A.

The inspection apparatus 7 includes a communication unit 70, a storage unit 71, an input device 72, an output device 73, and a processing unit 80. The inspection apparatus 7 also includes an optical part arranging device 90, an inspection light input device 91, and a photocurrent acquisition device 92. In the following description, a case in which the inspection apparatus 7 inspects the power monitoring element 15, the first monitoring element 21, and the second monitoring element 22 installed in the optical part 101 of the tunable optical source 1 is described. However, the inspection apparatus 7 according to the present embodiment may be configured to inspect the power monitoring element 15, the first monitoring element 21, and the second monitoring element 22 installed in the optical part 102 of the tunable optical source 2, in the optical part 103 of the tunable optical source 3, or in the optical part 104 of the tunable optical source 4.

The communication unit 70 communicates with the optical part arranging device 90, the inspection light input device 91, the photocurrent acquisition device 92, or the like, via the Internet in accordance with an HTTP (Hypertext Transfer Protocol). The communication unit 70 provides data, received from the optical part arranging device 90, the inspection light input device 91, the photocurrent acquisition device 92, or the like, to the processing unit 80. Also, the communication unit 70 transmits data that is supplied from the processing unit 80, to the optical part arranging device 90, the inspection light input device 91, the photocurrent acquisition device 92, or the like.

The storage unit 71 includes at least one of a magnetic tape device, a magnetic disk device, and an optical disk device. The storage unit 71 stores programs or the like that are used for a process performed in the processing unit 80, such as an operating system program, a driver program, an application program, and data. For example, the storage unit 71 stores, as an application program, an inspection program that causes a computer to execute an inspection process for inspecting a photodetector in the tunable optical source. The inspection program may be installed into the storage unit 71 from a computer-readable removable recording medium such as a CD-ROM or a DVD, by using a conventional setup program or the like.

The storage unit 71 also stores various data used in the inspection process. Further, the storage unit 71 may temporarily store temporary data concerning a certain process.

Examples of the input device 72 include a touch panel, and a key button. Any types of devices that enable an operator to input data may be adopted as the input device 72. By using the input device 72, the operator can input a letter, a number, a symbol, and the like. When the input device 72 is operated by the operator, the input device 72 generates a signal corresponding to the operation. The generated signal is supplied to the processing unit 80 as an instruction from the operator.

Examples of the output device 73 include a liquid crystal display and an organic electro-luminescence display. Any types of devices, capable of displaying an image, a frame (video frame), or the like, may be adopted as the output device 73. Based on still image data or moving image data supplied from the processing unit 80, the output device 73 displays an image or a frame. The output device 73 may also be an output device for printing an image, a frame, a character, or the like, on a print medium.

The processing unit 80 includes one or more processors and peripheral circuits. The processing unit 80 controls an overall operation of the inspection apparatus 7, and an example of the processing unit 80 includes a CPU. The processing unit 80 performs a process based on the programs (a driver program, an operating system program, an application program, and the like) stored in the storage unit 71. Further, the processing unit 80 can execute multiple programs (such as multiple application programs) in parallel.

The processing unit 80 includes an arrangement module for inspection position 81, an inspection light input instruction module 82, a photocurrent acquisition module 83, a photocurrent determination module 84, and a determination result output module 85. These modules are functional modules embodied by the processor in the processing unit 80 executing programs. Alternatively, these modules may be implemented in the inspection apparatus 7 as firmware.

The optical part arranging device 90 moves each optical part 101, which was cut off from a wafer, to an inspection position (not illustrated), and moves the optical part 101 whose photodetector has been inspected to a storage position according to a result of the inspection.

The inspection light input device 91 includes a light source capable of controlling a quantity of light to be output, and an optical fiber output from the light source. The inspection light input device 91 inputs inspection light to the first inspection light input unit 410, the second inspection light input unit 420, and the optical output power inspection light input unit 430 of the optical part 101 that was moved to the inspection position by the optical part arranging device 90.

The photocurrent acquisition device 92 includes probes for detecting respective currents through the power monitoring element 15, the first monitoring element 21, and the second monitoring element 22, when the inspection light is input. The photocurrent acquisition device 92 also includes a memory unit for storing information of currents (amounts of currents) that are obtained through the probes (the information may also be referred to as "current information").

<Inspection Process by the Inspection Apparatus 7>

FIG. 17 is a flowchart illustrating a flow of the inspection process for inspecting a photodetector in the tunable optical source according to the above described embodiments performed by the inspection apparatus 7. The inspection process illustrated in FIG. 17 is mainly performed by the processing unit 80 interoperating with each element in the inspection apparatus 7, based on programs stored in the storage unit 71 in advance.

First, the arrangement module for inspection position 81 outputs a movement signal instructing to move the optical part 101 to the inspection position, to the optical part arranging device 90 (S201). In response to receiving the movement signal, the optical part arranging device 90 moves the optical part 101 to the inspection position.

Next, the inspection light input instruction module 82 outputs, to the inspection light input device 91, an inspection light input instruction signal instructing to input inspection light to the first inspection light input unit 410, the second inspection light input unit 420, and the optical output power inspection light input unit 430 of the optical part 101 (S202). In response to receiving the inspection light input instruction signal, the inspection light input device 91 inputs inspection light having a given quantity of light, to the first inspection light input unit 410, the second inspection light input unit 420, and the optical output power inspection light input unit 430 of the optical part 101. When the inspection light is input, the photocurrent acquisition device 92 stores the current information related to the currents through the power monitoring element 15, the first monitoring element 21, and the second monitoring element 22.

Next, the photocurrent acquisition module 83 acquires the current information stored by the photocurrent acquisition device 92 (S203). The photocurrent determination module 84 determines if the current information (that is, amounts of currents acquired from photodetectors) fulfils a predetermined condition (S204). If it is determined, by the photocurrent determination module 84, that the current information fulfils the predetermined condition (S204—YES), the determination result output module 85 outputs, to the optical part arranging device 90, a determination result signal indicating that an inspected photodetector is normal (S205). When the optical part arranging device 90 receives the determination result signal indicating that an inspected photodetector is normal, the optical part arranging device 90 moves the optical part 101 that is placed at the inspection position to a normal storage position.

If it is determined, by the photocurrent determination module 84, that the current information does not fulfil the predetermined condition (S204—NO), the determination result output module 85 outputs, to the optical part arranging device 90, a determination result signal indicating that an inspected photodetector is in failure (S206). When the optical part arranging device 90 receives the determination result signal indicating that an inspected photodetector is in failure, the optical part arranging device 90 moves the optical part 101 that is placed at the inspection position to an abnormal storage position.

In one aspect, in the tunable optical source according to the embodiments including: a substrate; a light source disposed on the substrate; a wavelength selecting element configured to select light of a specific wavelength as output light, from light emitted from the light source, in accordance with a control signal; a wavelength filter disposed on the substrate which includes multiple output ports corresponding to multiple routes of the output light; a photodetector disposed on the substrate configured to receive a light beam output from one of the plurality of output ports; an inspection waveguide connecting to the photodetector at one end; and an inspection light input unit for inputting inspection light which is provided at the other end of the inspection waveguide, an inspection method of an optical part of the tunable optical source includes a step of inputting the inspection light to the inspection light input unit, a step of acquiring current information representing an amount of current that is output from the photodetector, a step of determining whether or not the amount of current corresponding to the current information fulfils a predetermined condition, and a step of outputting a determination result signal indicating a result of the step of determining.

All examples and conditional language provided herein are intended for pedagogical purposes of aiding the reader in understanding the invention and the concepts contributed by the inventors to further the art, and are not to be construed as limitation to such specifically recited examples and conditions, nor does the organization of such examples in the specification relate to a showing of superiority and inferiority of the invention. Although one or more embodiments of the present invention have been described in detail, it should be understood that various changes, substitutions, and alterations could be made hereto without departing from the spirit and scope of the invention.

What is claimed is:

1. A tunable optical source comprising:
   a substrate;
   a light source disposed on the substrate;
   a wavelength selecting element configured to select light of a specific wavelength as output light, from light emitted from the light source, in accordance with a control signal;
   a wavelength filter including a plurality of output ports, the wavelength filter being disposed on the substrate and being configured to receive a part of the output light and to output light beams to the respective output ports;
   a photodetector disposed on the substrate so as to receive the light beam output from one of the plurality of output ports;
   an inspection waveguide connecting to the photodetector at one end; and
   an inspection light input unit for inputting inspection light, the inspection light input unit being provided at another end of the inspection waveguide.

2. A tunable optical source comprising:
   a substrate;
   a light source disposed on the substrate;
   a wavelength selecting element configured to select light of a specific wavelength as output light, from light emitted from the light source, in accordance with a control signal;
   a wavelength filter including a plurality of output ports, the wavelength filter being disposed on the substrate and being configured to receive a part of the output light and to output light beams to the respective output ports;
   a photodetector disposed on the substrate so as to receive the light beam output from one of the plurality of output ports;
   an inspection waveguide connecting to the photodetector at one end;
   an inspection light input unit for inputting inspection light, the inspection light input unit being provided at another end of the inspection waveguide; and
   a control part configured to generate the control signal and to output the control signal to the wavelength selecting element, the control signal being generated based on an inspection signal obtained from the photodetector, and the wavelength selecting element being controlled by the control signal such that a wavelength of the output light becomes equal to a target wavelength.

3. The tunable optical source according to claim 2, further including
   a photodetector for optical output power,
   an optical output power inspection waveguide connecting to the photodetector for optical output power at one end, and
   an optical output power inspection light input unit provided at another end of the optical output power inspection waveguide.

4. The tunable optical source according to claim 3, further including a splitter configured to split the inspection light into a plurality of inspection beams and to output the inspection beams to the inspection waveguide and the optical output power inspection waveguide.

5. The tunable optical source according to claim 3, further including
   a same number of photodetectors as a number of the output ports, each of the photodetectors being disposed so as to face one of the output ports, and
   a splitter configured to split the inspection light into a plurality of inspection beams and to output the inspection beams to the respective photodetectors.

6. The tunable optical source according to claim 3, wherein at least one of the inspection light input unit and the optical output power inspection light input unit is disposed at an end surface of the substrate.

7. The tunable optical source according to claim 3, further including a grating coupler configured to receive light emitted from above the substrate and to output the received light to the inspection waveguide and the optical output power inspection waveguide.

8. An optical module comprising:
   a tunable optical source; and
   an optical modulator configured to modulate output light received from the tunable optical source and to output the modulated output light,
   the tunable optical source including
      a substrate;
      a light source disposed on the substrate;
      a wavelength selecting element configured to select light of a specific wavelength as output light, from light emitted from the light source, in accordance with a control signal;
   a wavelength filter including a plurality of output ports, the wavelength filter being disposed on the substrate and being configured to receive a part of the output light and to output light beams to the respective output ports;
      a photodetector disposed on the substrate so as to receive the light beam output from one of the plurality of output ports;
      an inspection waveguide connecting to the photodetector at one end;
      an inspection light input unit for inputting inspection light, the inspection light input unit being provided at another end of the inspection waveguide; and
      a control part configured to generate the control signal and to output the control signal to the wavelength selecting element, the control signal being generated based on an inspection signal obtained from the photodetector, and the wavelength selecting element being controlled by the control signal such that a wavelength of the output light becomes equal to a target wavelength.

* * * * *